(12) United States Patent
Mori

(10) Patent No.: US 10,483,391 B2
(45) Date of Patent: Nov. 19, 2019

(54) SEMICONDUCTOR DEVICE AND METHOD FOR MANUFACTURING THE SAME

(71) Applicant: RENESAS ELECTRONICS CORPORATION, Tokyo (JP)

(72) Inventor: Takahiro Mori, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/845,628

(22) Filed: Dec. 18, 2017

(65) Prior Publication Data

US 2018/0182890 A1    Jun. 28, 2018

(30) Foreign Application Priority Data

Dec. 28, 2016    (JP) .................................. 2016-255178

(51) Int. Cl.
*H01L 29/78*    (2006.01)
*H01L 29/10*    (2006.01)
(Continued)

(52) U.S. Cl.
CPC ...... *H01L 29/7825* (2013.01); *H01L 29/0653* (2013.01); *H01L 29/0692* (2013.01); *H01L 29/1095* (2013.01); *H01L 29/402* (2013.01); *H01L 29/408* (2013.01); *H01L 29/4236* (2013.01); *H01L 29/66659* (2013.01); *H01L 29/66704* (2013.01); *H01L 29/7835* (2013.01); *H01L 29/1045* (2013.01)

(58) Field of Classification Search
CPC ............... H01L 29/7825; H01L 29/402; H01L 29/0692; H01L 29/0653; H01L 29/7835; H01L 29/66659; H01L 29/4236; H01L 29/408; H01L 29/1095; H01L 29/66704; H01L 29/1045
See application file for complete search history.

(56) References Cited

U.S. PATENT DOCUMENTS

2005/0001265 A1*    1/2005    Shiraki ............. H01L 21/76286
                                                              257/330
2015/0243777 A1*    8/2015    Fujii .................... H01L 29/7816
                                                              257/337

FOREIGN PATENT DOCUMENTS

| JP | 2005-026664 A | 1/2005 |
| JP | 2009-049260 A | 3/2009 |
| JP | 2015-162581 A | 9/2015 |

* cited by examiner

*Primary Examiner* — Matthew L Reames
*Assistant Examiner* — Benjamin T Liu
(74) *Attorney, Agent, or Firm* — McDermott Will & Emery LLP

(57) ABSTRACT

A semiconductor device according to one embodiment includes a semiconductor substrate having a first surface, an insulating isolation film disposed at the first surface, and a gate electrode. The semiconductor substrate has a source region, a drain region, a drift region, and a body region. The insulating isolation film has a first portion disposed inside the drift region in plan view, a second portion protruding from the first portion in a direction toward the source region, and a third portion protruding from the first portion in the direction toward the source region and sandwiching the drift region between the second portion and the third portion. The gate electrode faces a portion of the body region sandwiched between the source region and the drift region with being insulated from the portion. The gate electrode is disposed so as to extend over the second portion and the third portion.

7 Claims, 22 Drawing Sheets

(51) Int. Cl.
*H01L 29/40* (2006.01)
*H01L 29/423* (2006.01)
*H01L 29/66* (2006.01)
*H01L 29/06* (2006.01)

SEMICONDUCTOR DEVICE AND METHOD FOR MANUFACTURING THE SAME

This nonprovisional application is based on Japanese Patent Application No. 2016-255178 filed on Dec. 28, 2016 with the Japan Patent Office, the entire contents of which are hereby incorporated by reference.

BACKGROUND OF THE INVENTION

Field of the Invention

The present invention relates to a semiconductor device and a method for manufacturing the same.

Description of the Background Art

As a structure of an LDMOS (Laterally Diffused Metal Oxide Semiconductor) transistor, a structure described in Japanese Patent Laying-Open No. 2015-162581 (Patent Document 1) has been conventionally known. Patent Document 1 describes structures of a first LDMOS transistor and a second LDMOS transistor.

The first LDMOS transistor described in Patent Document 1 has a semiconductor substrate, an isolation insulating film, and a gate electrode. The semiconductor substrate has an upper surface. The semiconductor substrate has a source region and a drain region disposed in contact with the upper surface, a drift region disposed in contact with the upper surface so as to surround the drain region, and a well region sandwiched between the drift region and the source region and disposed in contact with the upper surface so as to surround the source region. The isolation insulating film is disposed on the upper surface side of the semiconductor substrate so as to be sandwiched between the drain region and the drift region. The gate electrode faces a portion of the well region sandwiched between the drift region and the source region, with being insulated from the portion by a gate insulating film.

In the first LDMOS transistor described in Patent Document 1, electric field concentration is likely to occur in the vicinity of an end of the isolation insulating film closer to a source. At a location where an electric field concentrates, carriers constituting a current are accelerated by the electric field and impact-ionized, and thereby hot carriers are likely to be generated. As a result, according to the first LDMOS transistor described in Patent Document 1, degradation of the gate insulating film due to hot carrier injection may occur.

The second LDMOS transistor described in Patent Document 1 has a structure for suppressing such degradation of the gate insulating film due to hot carrier injection. More specifically, in the second LDMOS transistor described in Patent Document 1, a gate electrode has a portion embedded in an isolation insulating film. In this point, the second LDMOS transistor described in Patent Document 1 is different from the first LDMOS transistor described in Patent Document 1.

In the second LDMOS transistor described in Patent Document 1, the portion of the gate electrode embedded in the isolation insulating film depletes a drift region in the vicinity of an end of the isolation insulating film closer to a source region, and alleviates electric field concentration in the vicinity of the end of the isolation insulating film closer to the source region. Thus, according to the second LDMOS transistor described in Patent Document 1, degradation of the gate insulating film due to hot carrier injection is suppressed.

As structures of other LDMOS transistors, a structure described in Japanese Patent Laying-Open No. 2009-49260 and a structure described in Japanese Patent Laying-Open No. 2005-26664 have been known.

SUMMARY OF THE INVENTION

In the second LDMOS transistor described in Patent Document 1, the portion of the gate electrode embedded in the isolation insulating film is formed in a channel width direction (i.e., a direction intersecting with a direction from the source region toward a drain region). Accordingly, electric field alleviation in the vicinity of the end of the isolation insulating film closer to the source region is not always sufficient.

Other issues and novel features will be apparent from the description of this specification and the accompanying drawings.

A semiconductor device according to one embodiment includes a semiconductor substrate having a first surface, an insulating isolation film disposed at the first surface, and a gate electrode. The semiconductor substrate has a source region disposed in contact with the first surface, a drain region disposed in contact with the first surface, a drift region disposed in contact with the first surface so as to surround the drain region, and a body region sandwiched between the drift region and the source region and disposed in contact with the first surface so as to surround the source region.

The source region, the drain region, and the drift region are of a first conductivity type. The body region is of a second conductivity type which is opposite to the first conductivity type. The insulating isolation film has a first portion disposed inside the drift region in plan view, a second portion protruding from the first portion in a direction toward the source region, and a third portion protruding from the first portion in the direction toward the source region and sandwiching the drift region between the second portion and the third portion. The gate electrode faces a portion of the body region sandwiched between the source region and the drift region, with being insulated from the portion. The gate electrode is disposed so as to extend over the second portion and the third portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
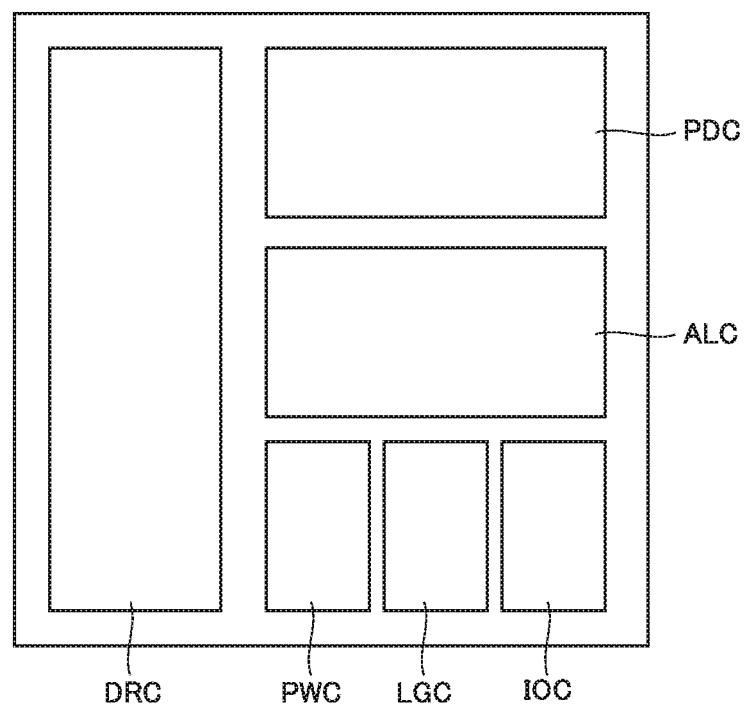
FIG. 1 is a schematic view showing an entire structure of a semiconductor device according to a first embodiment.

In the following, embodiments will be described with reference to the drawings, in which identical or corresponding parts will be designated by the same reference numerals, and the description thereof will not be repeated.

(First Embodiment)

Hereinafter, a configuration of a semiconductor device according to a first embodiment will be described with reference to the drawings. As shown in FIG. 1, the semiconductor device according to the first embodiment has a driver circuit DRC, a predriver circuit PDC, an analog circuit ALC, a power supply circuit PWC, a logic circuit LGC, and an input/output circuit IOC, for example. The semiconductor device according to the first embodiment is a semiconductor device in which, for example, a bipolar transistor, a CMOS (Complementary Metal Oxide Semiconductor) transistor, and an LDMOS transistor are mounted in a mixed manner.

Figure 2:
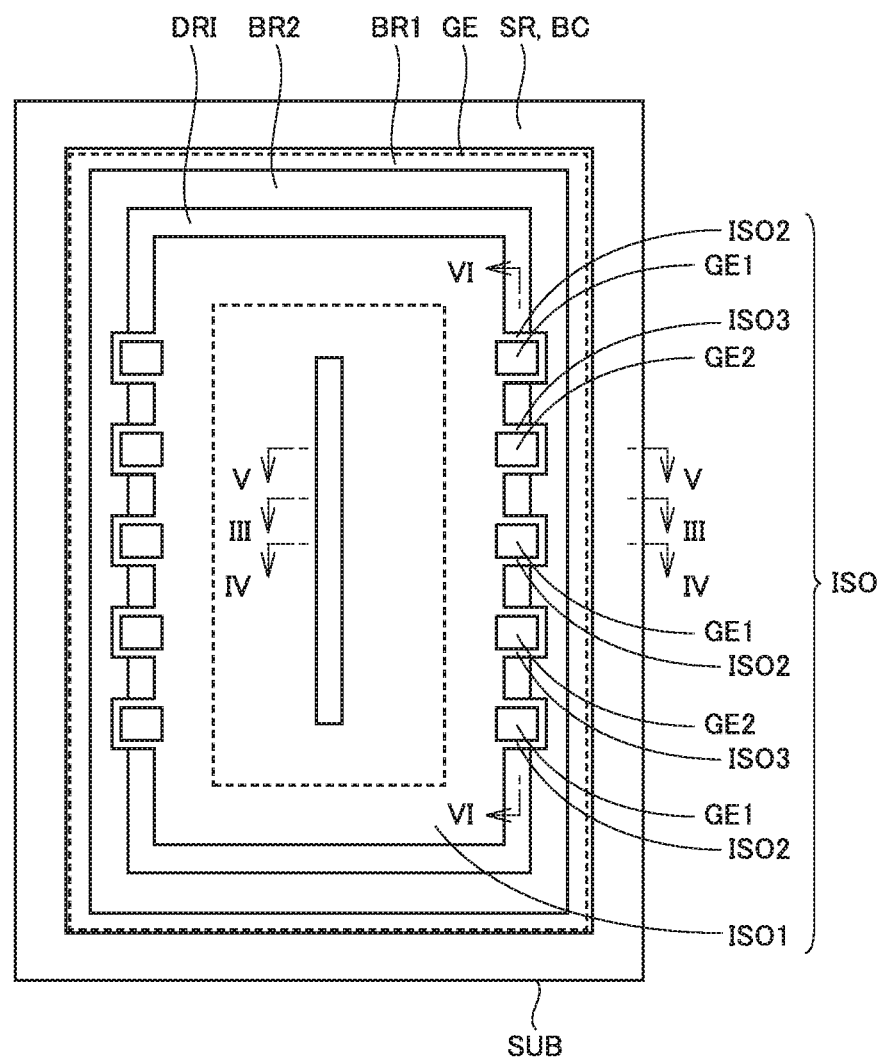
FIG. 2 is a top view in an input/output circuit of the semiconductor device according to the first embodiment.

As shown in FIG. 2, the semiconductor device according to the first embodiment has an LDMOS transistor in input/output circuit IOC, for example. More specifically, the semiconductor device according to the first embodiment has a semiconductor substrate SUB, an insulating isolation film ISO, and a gate electrode GE, in input/output circuit IOC. Although not shown in FIG. 2, the semiconductor device according to the first embodiment further has a gate insulating film GO, an interlayer insulating film ILD, contact plugs CP, and a wiring WL.

Figure 3:
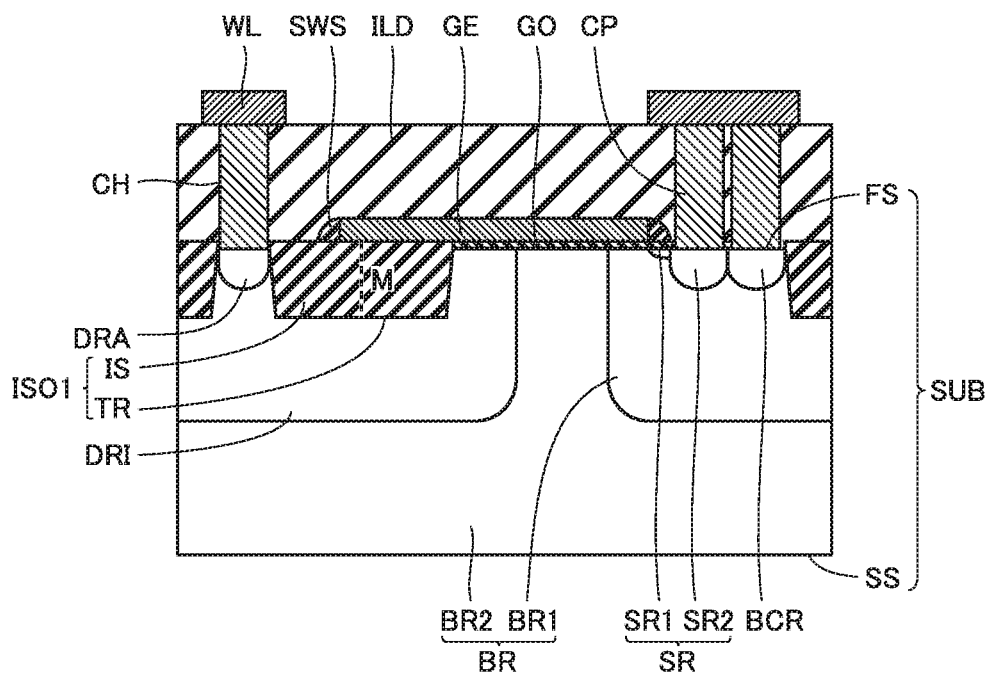
FIG. 3 is a cross sectional view in III-III of FIG. 2.

As shown in FIG. 3, semiconductor substrate SUB has a first surface FS and a second surface SS. Semiconductor substrate SUB is composed of monocrystalline silicon (Si), for example.

Semiconductor substrate SUB has a source region SR, a drain region DRA, a body region BR, and a drift region DRI. Semiconductor substrate SUB may further have a body contact region BCR.

Source region SR is disposed in contact with first surface FS. Source region SR may have a first portion SR1 and a second portion SR2. First portion SR1 is disposed below a sidewall spacer SWS described later. Second portion SR2 is disposed adjacent to first portion SR1. First portion SR1 has an impurity concentration lower than that of second portion SR2. That is, first portion SR1 has an LDD (Lightly Doped Drain) structure.

Drain region DRA is disposed in contact with first surface FS. Body contact region BCR is disposed in contact with first surface FS. Source region SR and drain region DRA have a first conductivity type. The first conductivity type is n type or p type. Body contact region BCR has a second conductivity type. The second conductivity type is a conductivity type opposite to the first conductivity type. That is, when the first conductivity type is n type, the second conductivity type is p type, and when the first conductivity type is p type, the second conductivity type is n type.

Drift region DRI surrounds drain region DRA. Further, drift region DRI is disposed in contact with first surface FS. Drift region DRI has the first conductivity type. Preferably, drift region DRI has an impurity concentration lower than those of source region SR and drain region DRA.

Body region BR surrounds source region SR and body contact region BCR. Body region BR is sandwiched between source region SR and drift region DRI. A portion of body region BR sandwiched between source region SR and drift region DRI serves as a channel region. Body region BR is disposed in contact with first surface FS. Body region BR has the second conductivity type.

Body region BR may have a first portion BR1 and a second portion BR2. First portion BR1 surrounds source region SR and body contact region BCR, and is disposed in contact with first surface FS. Second portion BR2 is disposed so as to surround first portion BR1. First portion BR1 has an impurity concentration higher than that of drift region DRI.

Insulating isolation film ISO is disposed at first surface FS of semiconductor substrate SUB. Insulating isolation film ISO is an STI (Shallow Trench Isolation), for example. That is, insulating isolation film ISO is composed of a trench TR and an insulator IS. Trench TR is provided in first surface FS and extends toward second surface SS. Insulator IS is embedded in trench TR. Insulator IS is composed of silicon dioxide ($SiO_2$), for example. The insulating isolation film may be a LOCOS (Local Oxidation Of Silicon).

Insulating isolation film ISO has a first portion ISO1. More specifically, in plan view (i.e., when viewed in a direction perpendicular to first surface FS), first portion ISO1 is disposed inside drift region DRI.

Gate insulating film GO is disposed on first surface FS. More specifically, gate insulating film GO is disposed on the portion of body region BR sandwiched between source region SR and drift region DRI (i.e., on the channel region). The gate insulating film is composed of $SiO_2$, for example.

Gate electrode GE is disposed on gate insulating film GO. That is, gate electrode GE faces the portion of body region BR sandwiched between source region SR and drift region DRI, with being insulated from the portion. Gate electrode GE is composed of polycrystalline Si doped with an impurity, for example. At each end of gate electrode GE, sidewall spacer SWS may be disposed. Sidewall spacer SWS is composed of $SiO_2$, for example.

Interlayer insulating film ILD is disposed on first surface FS. In interlayer insulating film ILD, contact holes CH are formed. Contact holes CH are disposed on source region SR, drain region DRA, and body contact region BCR. Although not shown in FIG. 3, contact hole CH is also disposed on gate electrode GE. Contact holes CH penetrate interlayer insulating film ILD. Interlayer insulating film ILD is composed of $SiO_2$, for example.

Contact plugs CP are disposed in interlayer insulating film ILD. Specifically, each contact plug CP is embedded in contact hole CH. Contact plugs CP are electrically connected to source region SR, drain region DRA, body contact region BCR, and gate electrode GE. Contact plugs CP are composed of tungsten (W), for example.

Wiring WL is disposed on interlayer insulating film ILD. Wiring WL is electrically connected to contact plugs CP. Thus, wiring WL is electrically connected to source region SR, drain region DRA, body contact region BCR, and gate electrode GE, via contact plugs CP. Wiring WL is composed of aluminum (Al), an aluminum alloy, or the like.

Figure 4:
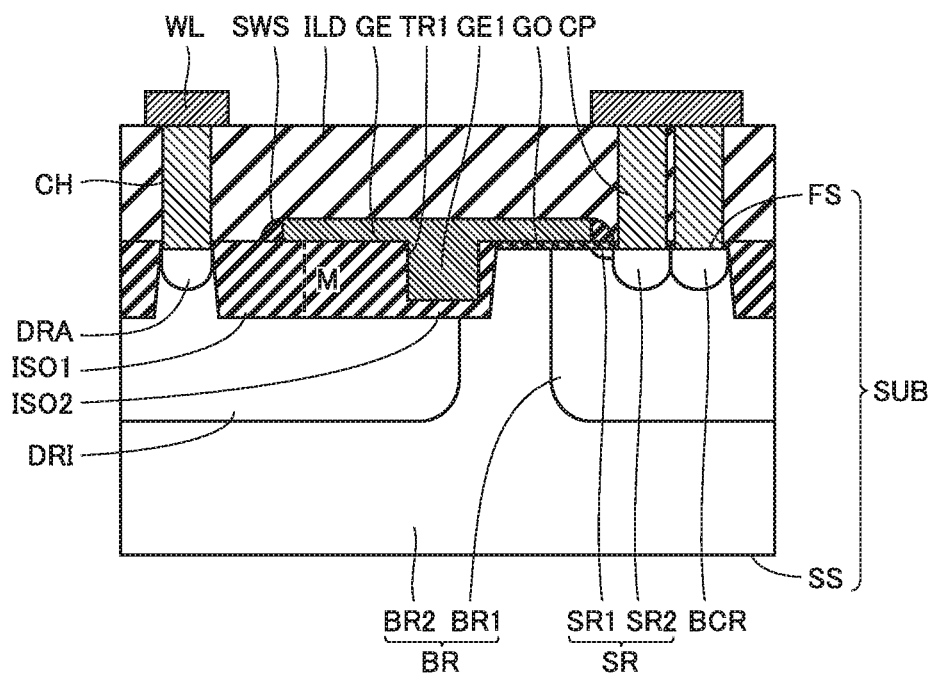
FIG. 4 is a cross sectional view in IV-IV of FIG. 2.

As shown in FIG. 4, insulating isolation film ISO has a second portion ISO2. Second portion ISO2 protrudes from first portion ISO1 toward source region SR. Preferably, second portion ISO2 protrudes toward source region SR to reach body region BR.

Gate electrode GE extends over second portion ISO2. Preferably, gate electrode GE may further extend over first portion ISO1. Preferably, gate electrode GE has a first embedded portion GE1. First embedded portion GE1 is embedded in second portion ISO2. That is, first embedded portion GE1 extends in a direction toward second surface SS. More specifically, a trench TR1 extending toward second surface SS is formed in second portion ISO2, and first embedded portion GE1 is embedded in trench TR1.

Preferably, an end of first embedded portion GE1 closer to drain region DRA is disposed closer to drift region DRI, than a midpoint M between an end of first portion ISO1 closer to drift region DRI and an end of first portion ISO1 closer to drain region DRA.

Figure 5:
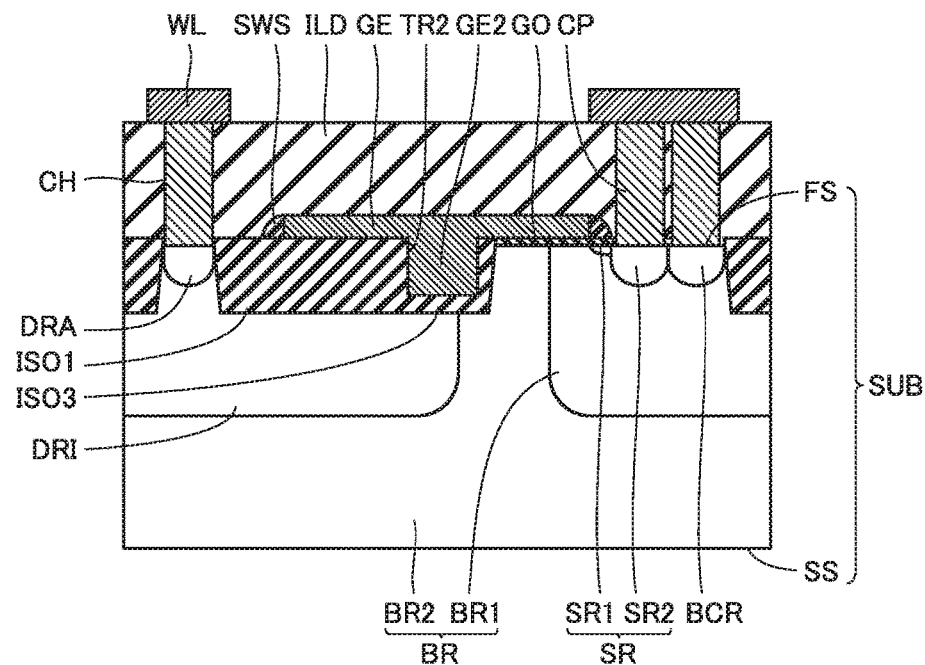
FIG. 5 is a cross sectional view in V-V of FIG. 2.

As shown in FIG. 5, insulating isolation film ISO has a third portion ISO3. Third portion ISO3 protrudes from first portion ISO1 toward source region SR. Preferably, third portion ISO3 protrudes toward source region SR to reach body region BR. Thereby, third portion ISO3 sandwiches drift region DRI between second portion ISO2 and third portion ISO3. Third portion ISO3 preferably protrudes toward source region SR to reach body region BR.

Gate electrode GE extends over third portion ISO3. Preferably, gate electrode GE may further extend over first portion ISO1. Preferably, gate electrode GE has a second embedded portion GE2. Second embedded portion GE2 is embedded in third portion ISO3. That is, second embedded portion GE2 extends in the direction toward second surface SS. More specifically, a trench TR2 extending toward second surface SS is formed in third portion ISO3, and second embedded portion GE2 is embedded in trench TR2.

Preferably, an end of second embedded portion GE2 closer to drain region DRA is disposed closer to drift region DRI, than midpoint M between the end of first portion ISO1 closer to drift region DRI and the end of first portion ISO1 closer to drain region DRA.

As shown in FIG. 2, drain region DRA extends in a direction intersecting with a direction from source region SR toward drain region DRA (i.e., in a channel width direction). Second portion ISO2 is located more outward than an end of drain region DRA in the channel width direction. Third portion ISO3 is located more inward than the end of drain region DRA in the channel width direction. That is, the portion of body region BR sandwiched between source region SR and drift region DRI (i.e., the channel region) is preferably terminated by second portion ISO2 at an end in the channel width direction.

Figure 6:
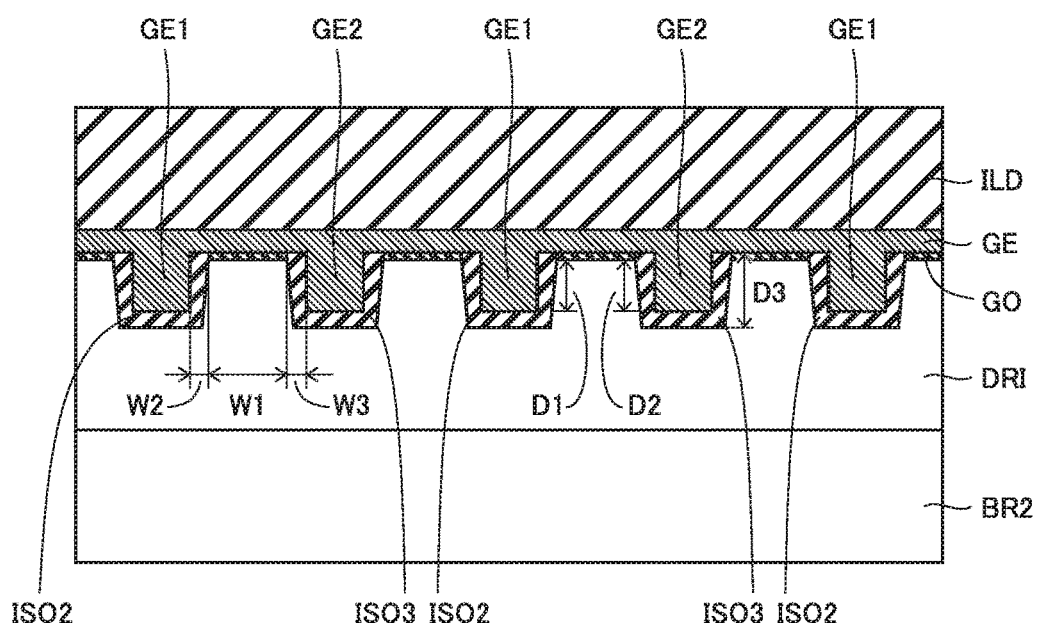
FIG. 6 is a cross sectional view in VI-VI of FIG. 2.

As shown in FIG. 6, drift region DRI is disposed between second portion ISO2 and third portion ISO3. Further, drift region DRI is preferably disposed between first embedded portion GE1 and second embedded portion GE2.

From another point of view, preferably, an end of first embedded portion GE1 closer to source region SR is located closer to source region SR than the end of first portion ISO1 closer to drift region DRI, and an end of second embedded portion GE2 closer to source region SR is located closer to source region SR than the end of first portion ISO1 closer to drift region DRI.

Drift region DRI sandwiched between first embedded portion GE1 and second embedded portion GE2 has a width W1 in the direction intersecting with the direction from source region SR toward drain region DRA.

Second portion ISO2 disposed between first embedded portion GE1 and drift region DRI sandwiched between first embedded portion GE1 and second embedded portion GE2 has a width W2. Third portion ISO3 disposed between second embedded portion GE2 and drift region DRI sandwiched between first embedded portion GE1 and second embedded portion GE2 has a width W3.

First embedded portion GE1 has a depth D1 in the direction toward second surface SS. Second embedded portion GE2 has a depth D2 in the direction toward second surface SS. Insulating isolation film ISO has a depth D3 in the direction toward second surface SS.

Preferably, width W2 and width W3 are less than or equal to 0.3 μm. Preferably, depth D1 and depth D2 are more than or equal to 0.25 times depth D3.

Figure 7:
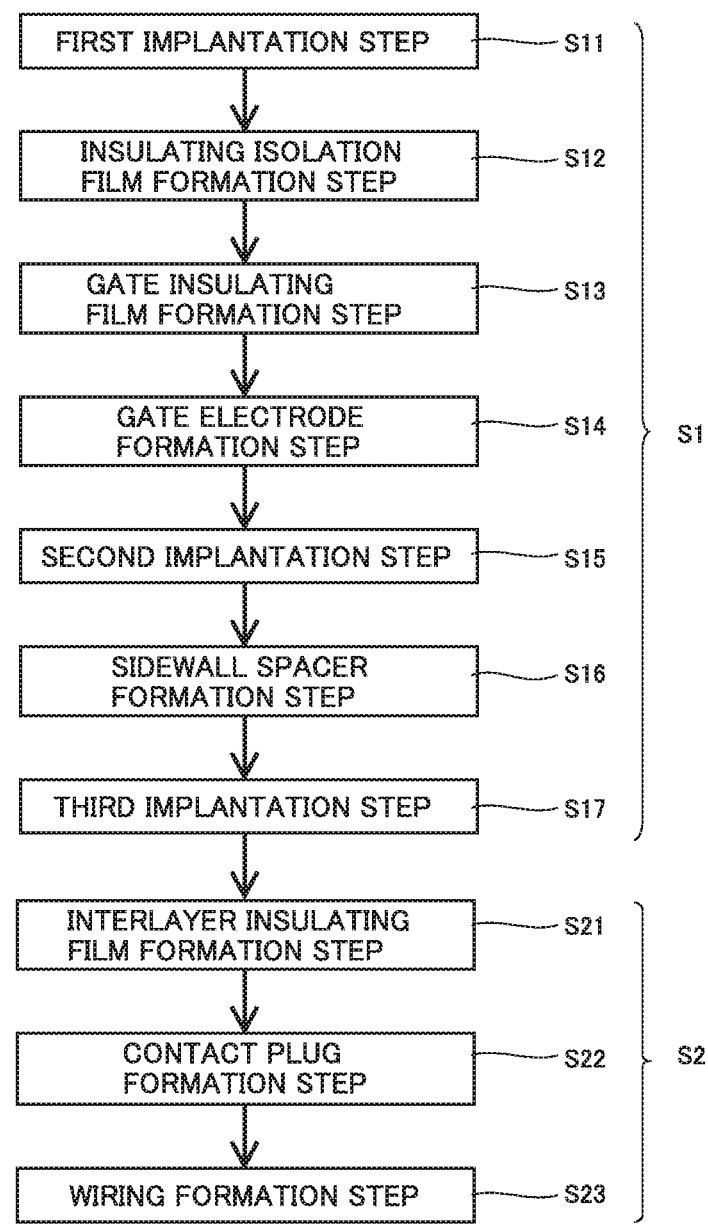
FIG. 7 is a process chart showing a method for manufacturing the semiconductor device according to the first embodiment.

Hereinafter, a method for manufacturing the semiconductor device according to the first embodiment will be described with reference to the drawings. As shown in FIG. 7, the method for manufacturing the semiconductor device according to the first embodiment has a front end step S1 and a back end step S2.

Front end step S1 has a first implantation step S11, an insulating isolation film formation step S12, a gate insulating film formation step S13, a gate electrode formation step S14, a second implantation step S15, a sidewall spacer formation step S16, and a third implantation step S17. Back end step S2 has an interlayer insulating film formation step S21, a contact plug formation step S22, and a wiring formation step S23.

Figure 8:
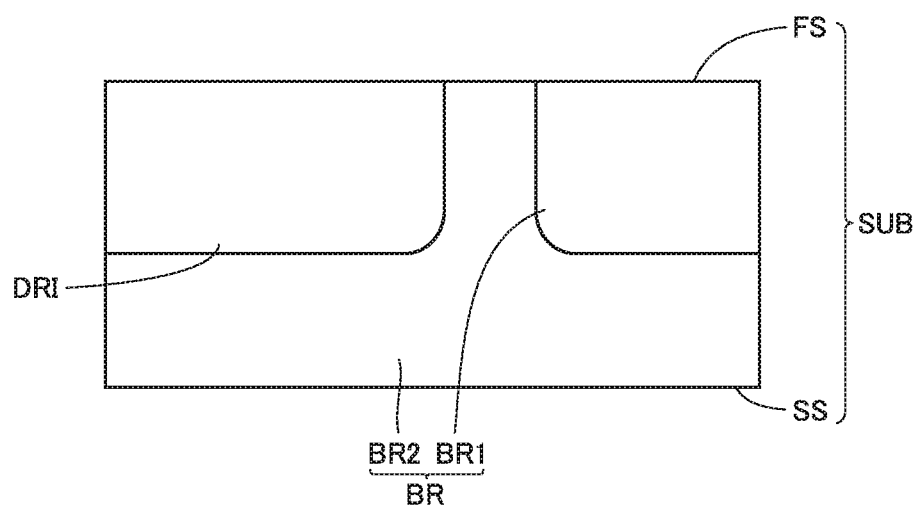
FIG. 8 is a cross sectional view of the semiconductor device according to the first embodiment, in a first implantation step.

As shown in FIG. 8, in first implantation step S11, drift region DRI and body region BR are formed. Drift region DRI and body region BR are formed by ion implantation, for example. Drift region DRI and body region BR may be formed by performing ion implantation and thereafter performing thermal diffusion. A portion of semiconductor substrate SUB in which drift region DRI and first portion BR1 are not formed serves as second portion BR2.

Figure 9A:
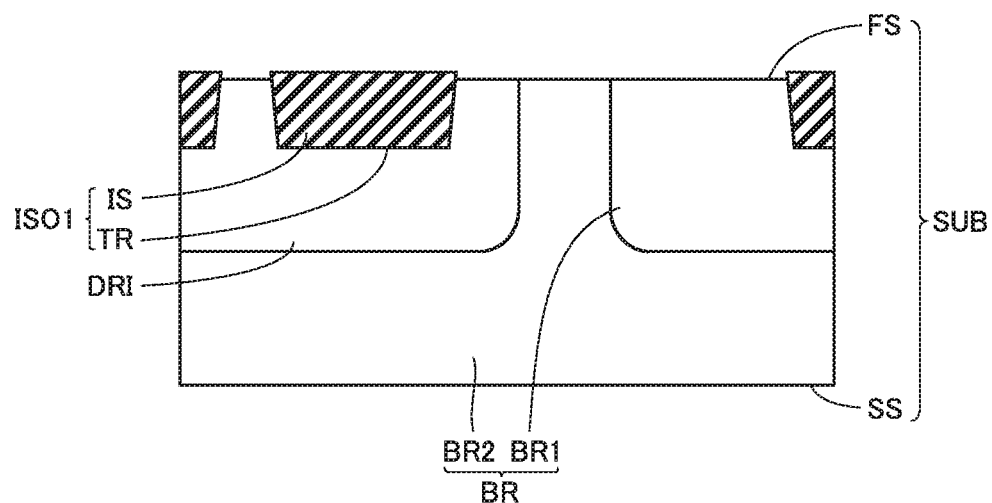
FIG. 9A is a cross sectional view of a portion of the semiconductor device according to the first embodiment in which a first portion is formed, in an insulating isolation film formation step.
Figure 9B:
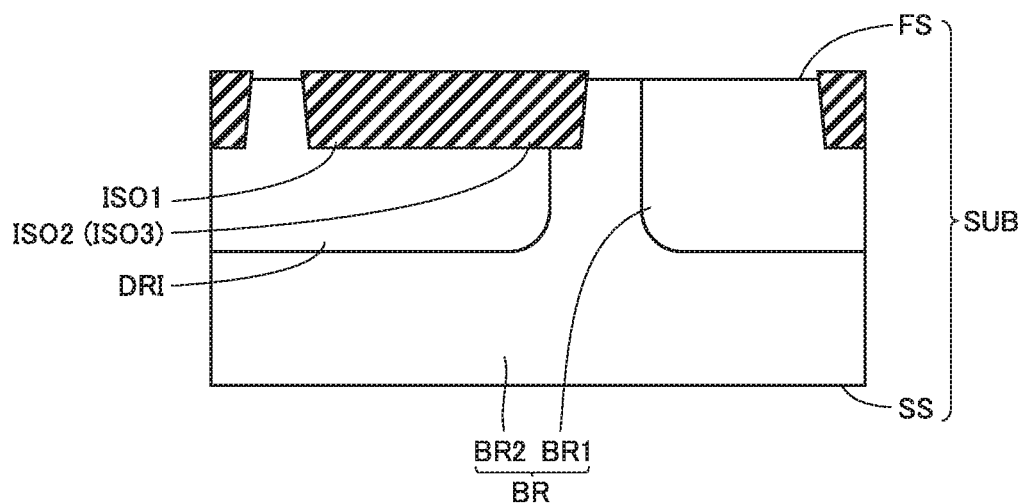
FIG. 9B is a cross sectional view of a portion of the semiconductor device according to the first embodiment in which a second portion and a third portion are formed, in the insulating isolation film formation step.

As shown in FIGS. 9A and 9B, in insulating isolation film formation step S12, formation of insulating isolation film ISO is performed. In the formation of insulating isolation film ISO, first, formation of trench TR is performed. The formation of trench TR is performed for example by anisotropic etching such as RIE (Reactive Ion Etching). In the formation of insulating isolation film ISO, second, embedding of insulator IS into trench TR is performed. The embedding of insulator IS into trench TR is performed by depositing insulator IS on first surface FS by CVD (Chemical Vapor Deposition) or the like, and removing insulator IS protruding from trench TR by CMP (Chemical Mechanical Polishing) or the like.

Figure 10A:
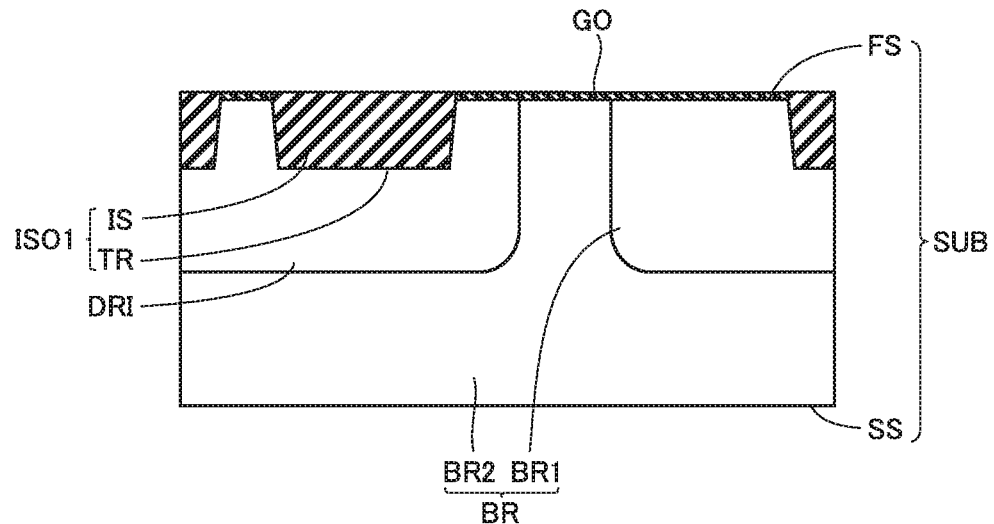
FIG. 10A is a cross sectional view of the portion of the semiconductor device according to the first embodiment in which the first portion is formed, in a gate insulating film formation step.
Figure 10B:
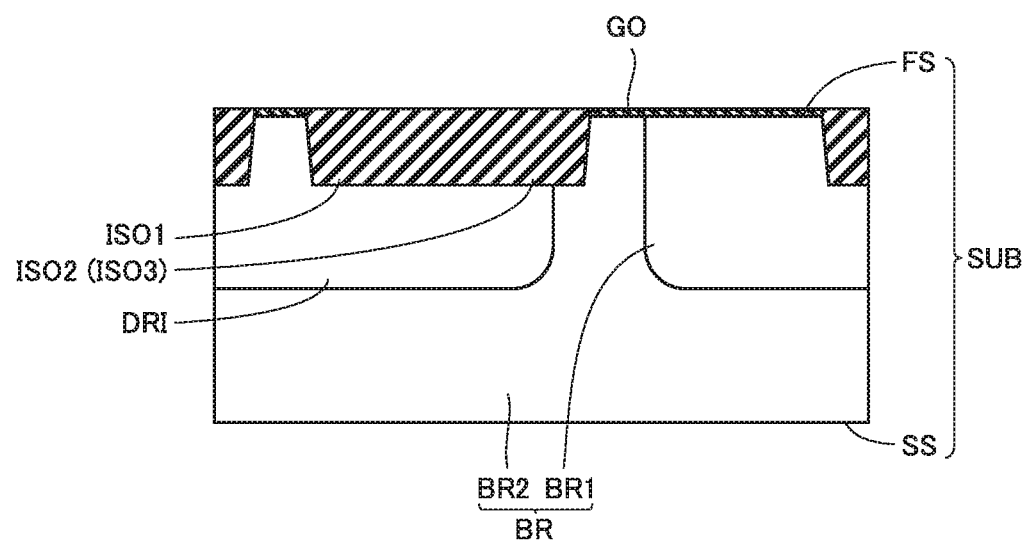
FIG. 10B is a cross sectional view of the portion of the semiconductor device according to the first embodiment in which the second portion and the third portion are formed, in the gate insulating film formation step.

As shown in FIGS. 10A and 10B, in gate insulating film formation step S13, gate insulating film GO is formed. The formation of gate insulating film GO is performed for example by thermally oxidizing the first surface FS side of semiconductor substrate SUB.

Figure 11A:
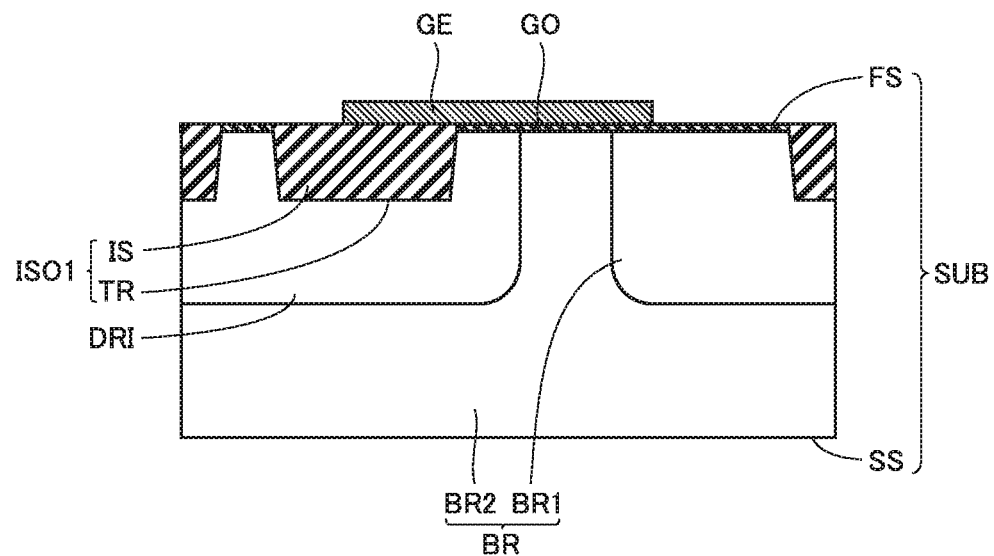
FIG. 11A is a cross sectional view of the portion of the semiconductor device according to the first embodiment in which the first portion is formed, in a gate electrode formation step.
Figure 11B:
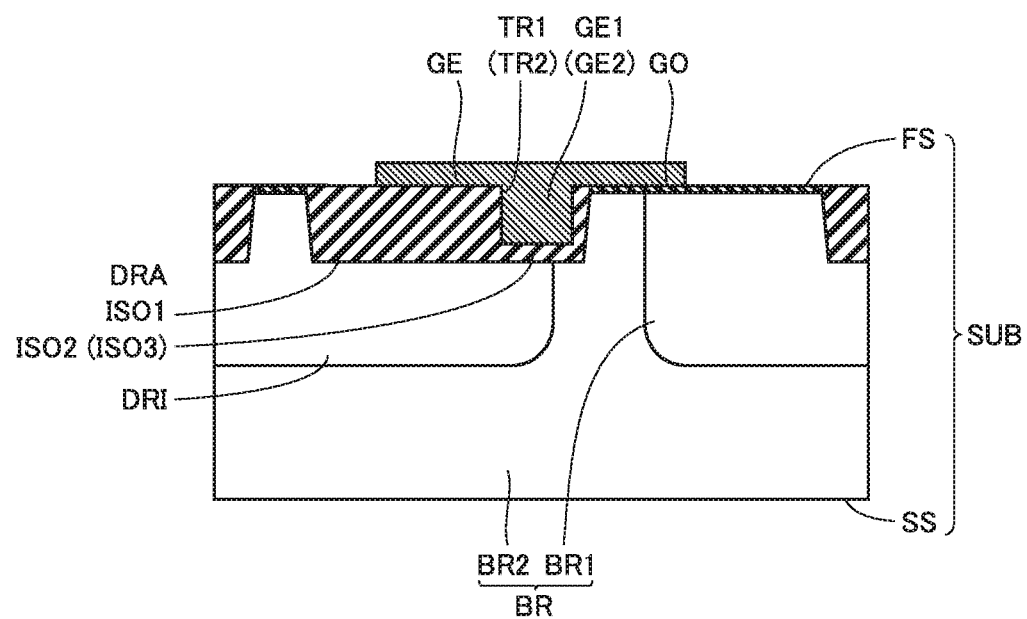
FIG. 11B is a cross sectional view of the portion of the semiconductor device according to the first embodiment in which the second portion and the third portion are formed, in the gate electrode formation step.

As shown in FIGS. 11A and 11B, in gate electrode formation step S14, formation of gate electrode GE is performed. In the formation of gate electrode GE, first, formation of trench TR1 and trench TR2 is performed in second portion ISO2 and third portion ISO3. The formation of trench TR1 and trench TR2 is performed for example by anisotropic etching such as RIE, using a photoresist as a mask.

In the formation of gate electrode GE, second, deposition of a material which composes gate electrode GE is performed. The deposition of the material which composes gate electrode GE is performed for example by CVD or the like. Thereby, the material which composes gate electrode GE is deposited on gate insulating film GO, on insulating isolation film ISO, and in trench TR1 and trench TR2.

In the formation of gate electrode GE, third, patterning of deposited gate electrode GE is performed. The patterning of deposited gate electrode GE is performed for example by photolithography. Thus, gate electrode GE having first embedded portion GE1 and second embedded portion GE2 is formed.

Figure 12A:
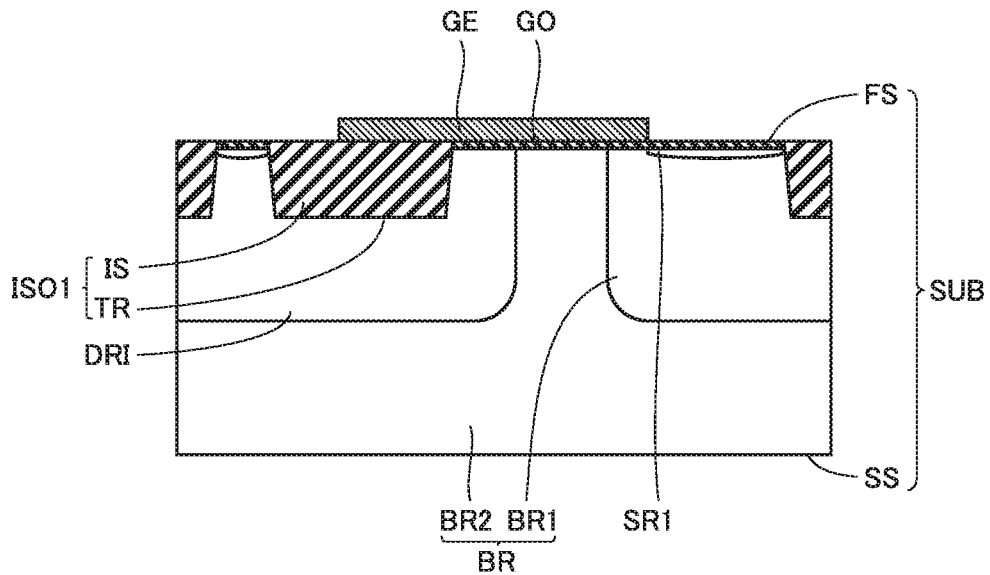
FIG. 12A is a cross sectional view of the portion of the semiconductor device according to the first embodiment in which the first portion is formed, in a second implantation step.
Figure 12B:
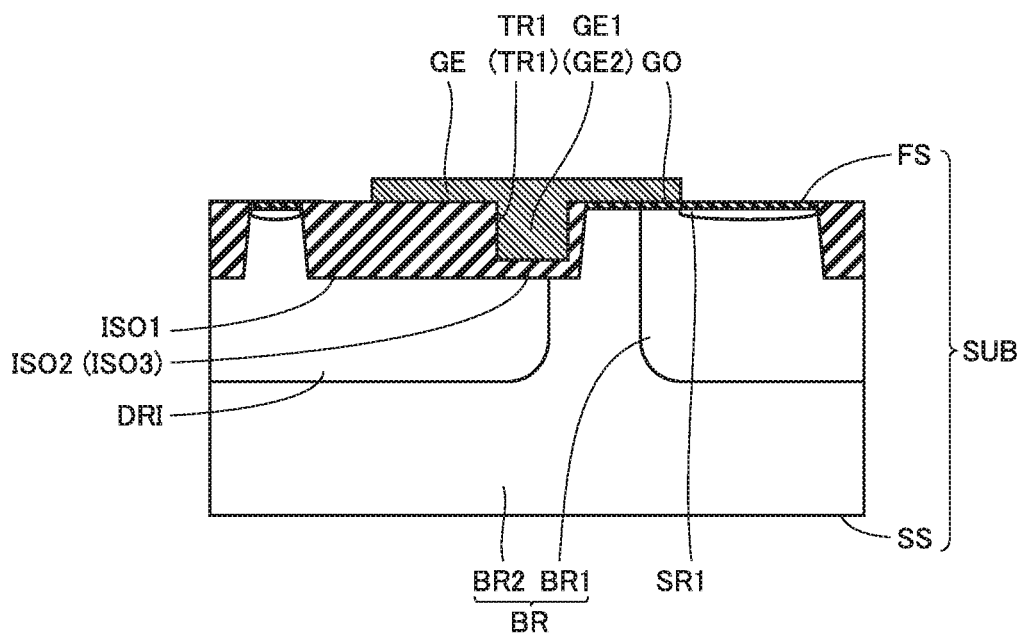
FIG. 12B is a cross sectional view of the portion of the semiconductor device according to the first embodiment in which the second portion and the third portion are formed, in the second implantation step.

As shown in FIGS. 12A and 12B, in second implantation step S15, formation of first portion SR1 is performed. The formation of first portion SR1 is performed for example by ion implantation using gate electrode GE and insulating isolation film ISO as a mask.

Figure 13A:
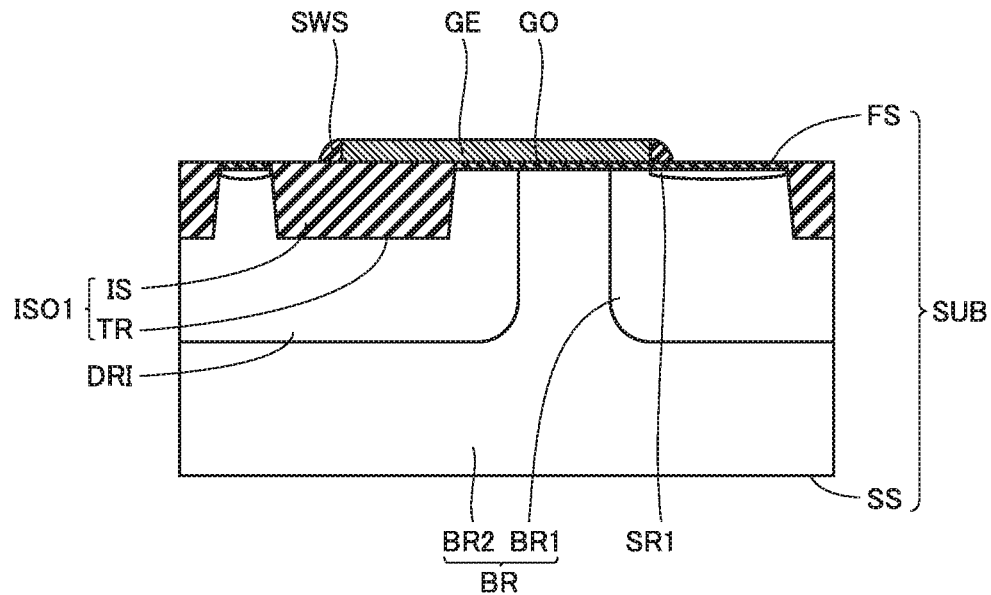
FIG. 13A is a cross sectional view of the portion of the semiconductor device according to the first embodiment in which the first portion is formed, in a sidewall spacer formation step.
Figure 13B:
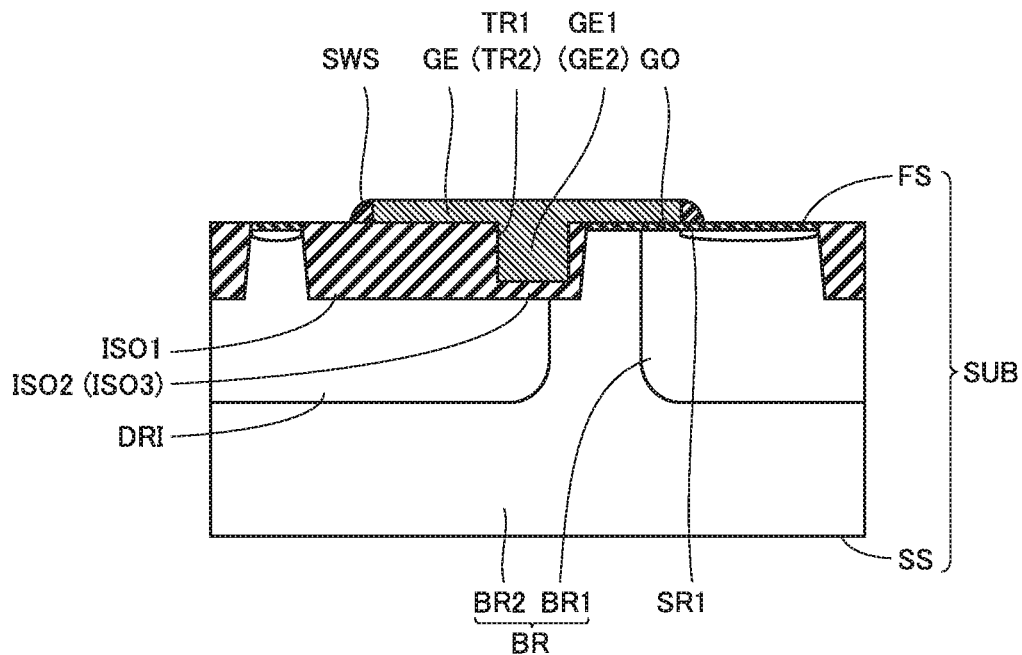
FIG. 13B is a cross sectional view of the portion of the semiconductor device according to the first embodiment in which the second portion and the third portion are formed, in the sidewall spacer formation step.

As shown in FIGS. 13A and 13B, in sidewall spacer formation step S16, sidewall spacer SWS is formed. In the formation of sidewall spacer SWS, first, a material which composes sidewall spacer SWS is deposited on first surface FS. In the formation of sidewall spacer SWS, second, the deposited material which composes sidewall spacer SWS is etched. Thus, the formation of sidewall spacer SWS is performed.

Figure 14A:
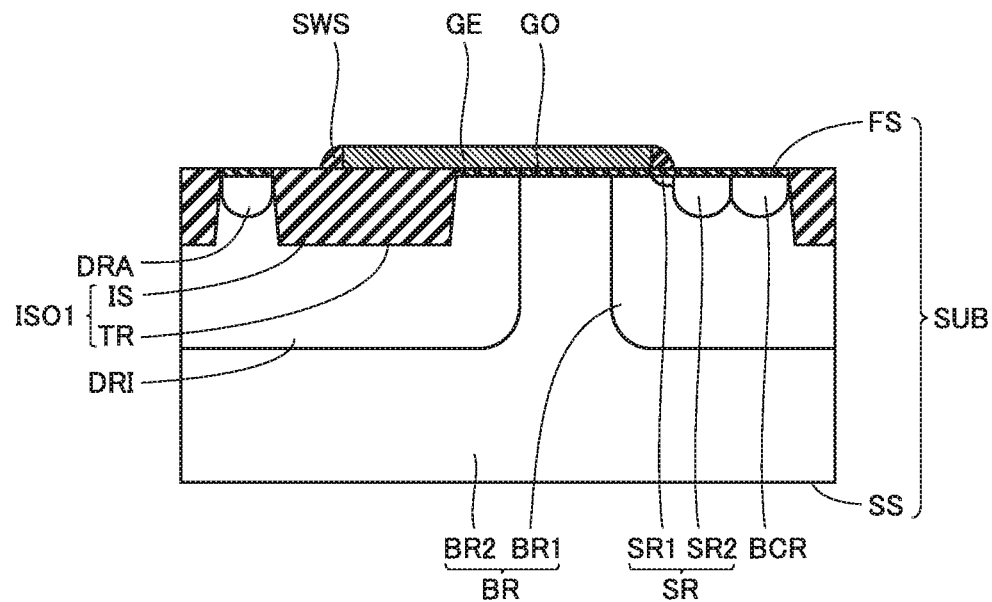
FIG. 14A is a cross sectional view of the portion of the semiconductor device according to the first embodiment in which the first portion is formed, in a third implantation step.
Figure 14B:
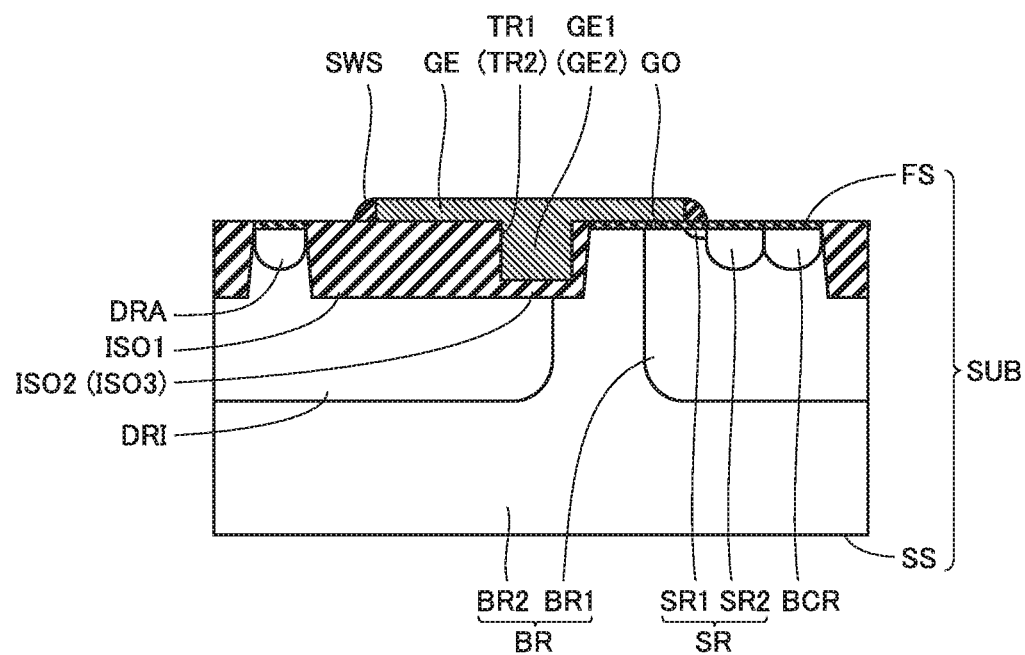
FIG. 14B is a cross sectional view of the portion of the semiconductor device according to the first embodiment in which the second portion and the third portion are formed, in the third implantation step.

As shown in FIGS. 14A and 14B, in third implantation step S17, formation of source region SR (second portion SR2), drain region DRA, and body contact region BCR is performed. The formation of second portion SR2, drain region DRA, and body contact region BCR is performed for example by ion implantation using gate electrode GE, sidewall spacer SWS, insulating isolation film ISO, and a photoresist as a mask.

Figure 15A:
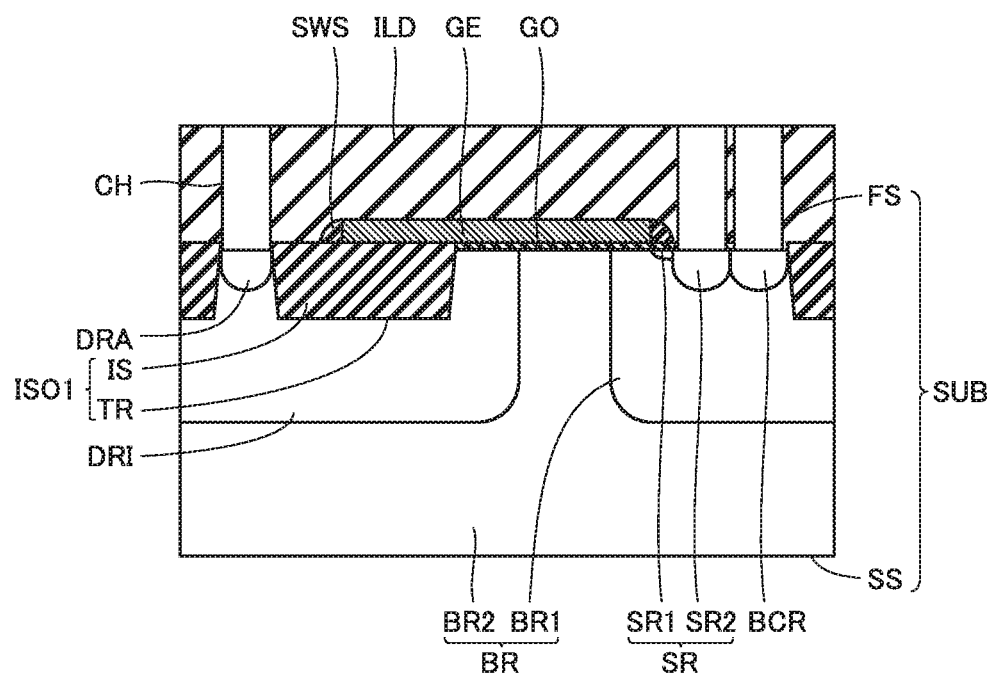
FIG. 15A is a cross sectional view of the portion of the semiconductor device according to the first embodiment in which the first portion is formed, in an interlayer insulating film formation step.
Figure 15B:
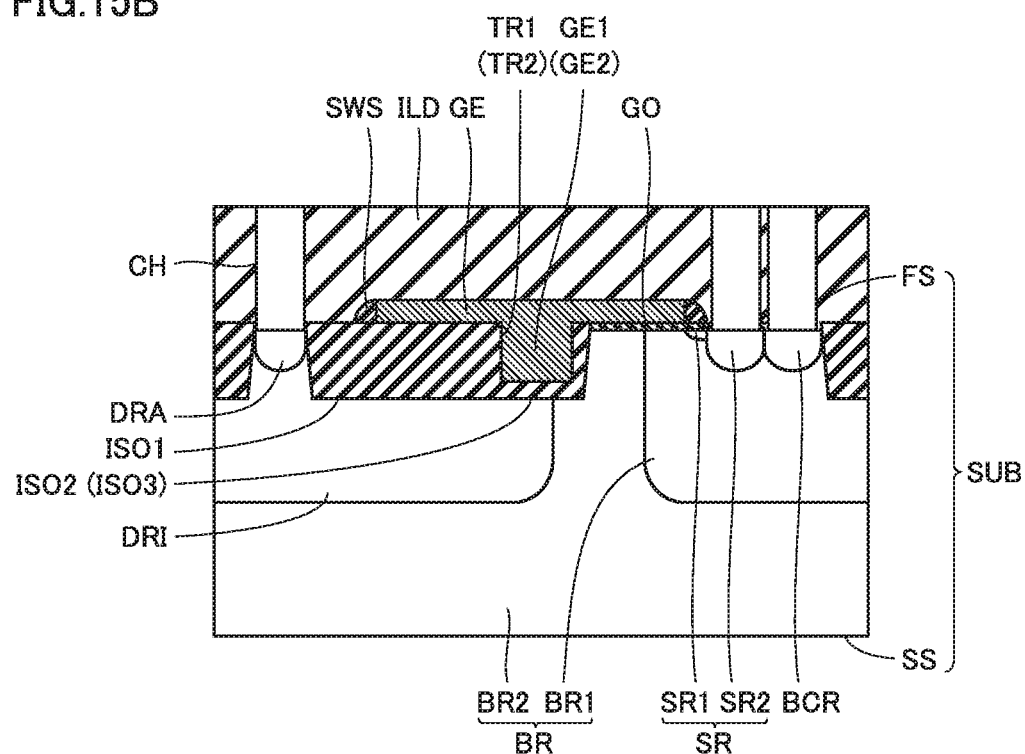
FIG. 15B is a cross sectional view of the portion of the semiconductor device according to the first embodiment in which the second portion and the third portion are formed, in the interlayer insulating film formation step.

As shown in FIGS. 15A and 15B, in interlayer insulating film formation step S21, formation of interlayer insulating film ILD is performed. In the formation of interlayer insulating film ILD, first, a material which composes interlayer insulating film ILD is deposited on first surface FS. The deposition of the material which composes interlayer insulating film ILD is performed for example by CVD.

In the formation of interlayer insulating film ILD, second, formation of contact holes CH is performed in interlayer insulating film ILD. The formation of contact holes CH is performed for example by anisotropic etching such as RIE. Thus, the formation of interlayer insulation film ILD provided with contact holes CH is performed.

Figure 16A:
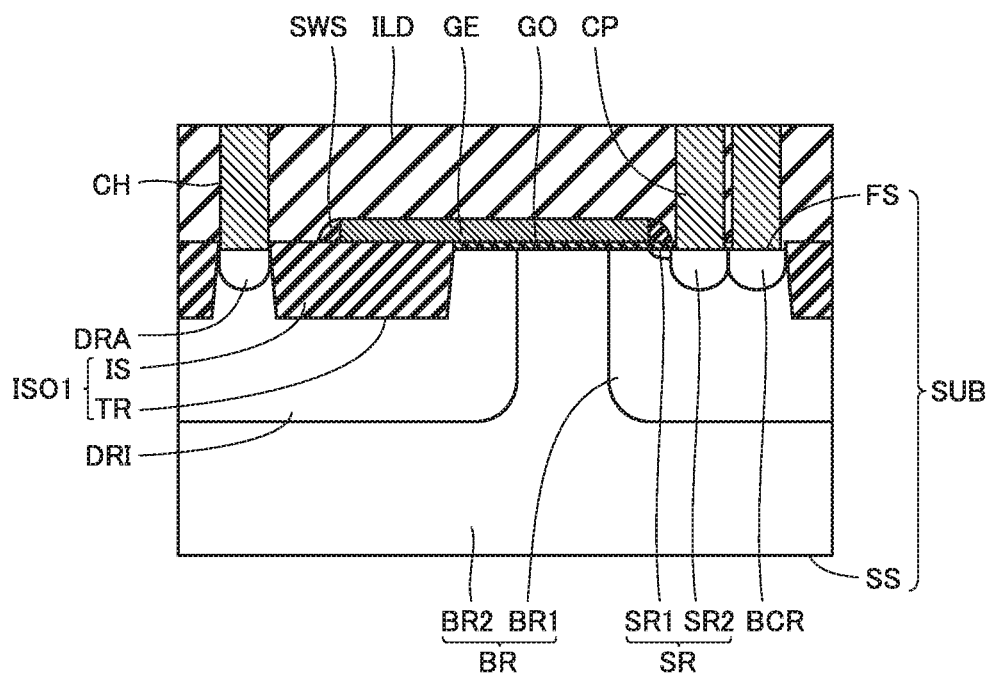
FIG. 16A is a cross sectional view of the portion of the semiconductor device according to the first embodiment in which the first portion is formed, in a contact plug formation step.
Figure 16B:
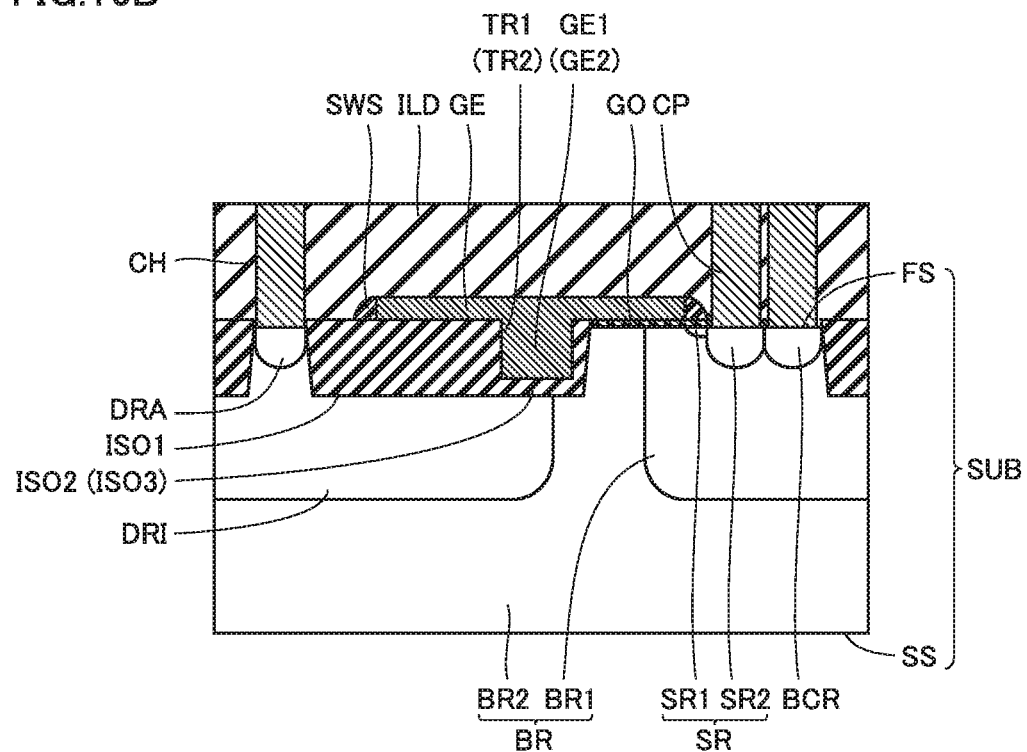
FIG. 16B is a cross sectional view of the portion of the semiconductor device according to the first embodiment in which the second portion and the third portion are formed, in the contact plug formation step.

As shown in FIGS. 16A and 16B, in contact plug formation step S22, formation of contact plugs CP is performed. The formation of contact plugs CP is performed by embedding a material which composes contact plugs CP into contact holes CH by CVD or the like, for example.

In wiring formation step S23, formation of wiring WL is performed. In the formation of wiring WL, first, a material which composes wiring WL is deposited on interlayer insulating film ILD by sputtering or the like, for example. In the formation of wiring WL, second, the deposited material which composes wiring WL is patterned by photolithography, for example.

Thus, the method for manufacturing the semiconductor device according to the first embodiment is completed, and the structure of the semiconductor device according to the first embodiment shown in FIGS. 2, 3, and 4 is formed. It should be noted that first implantation step S11 may be performed after insulating isolation film formation step S12.

Hereinafter, an effect of the semiconductor device according to the first embodiment will be described with reference to the drawings. As described above, the semiconductor device according to the first embodiment has second portion ISO2 and third portion ISO3 protruding from first portion ISO1 toward source region SR, and gate electrode GE extends over second portion ISO2 and third portion ISO3.

Figure 17:
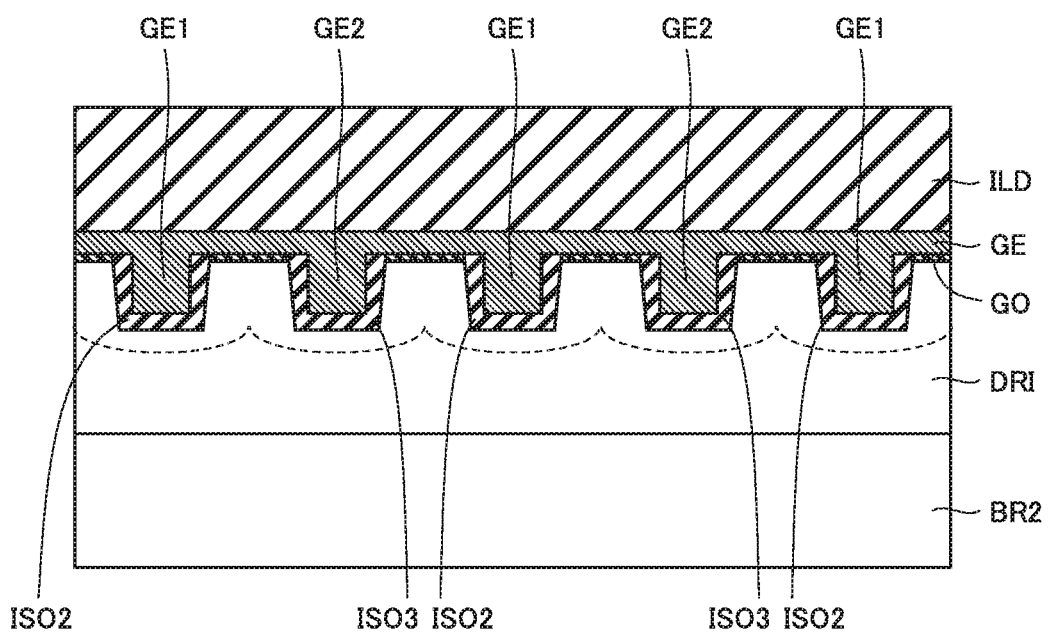
FIG. 17 is a schematic cross sectional view showing expansion of a depletion layer when a potential difference occurs between a drift region and a gate electrode.

Accordingly, when a potential difference occurs between gate electrode GE and drift region DRI, as shown in FIG. 17, a depletion layer (indicated in FIG. 17 by a dotted line) extends from both sides toward the vicinity of an end of first portion ISO1 closer to source region SR. Thus, electric field concentration in the vicinity of the end of first portion ISO1 closer to source region SR is alleviated, and hot carrier injection is suppressed.

When the semiconductor device according to the first embodiment has first embedded portion GE1 and second embedded portion GE2, since first embedded portion GE1 and second embedded portion GE2 extend toward second surface SS, the depletion layer described above extends to a deeper position in the vicinity of the end of first portion ISO1 closer to source region SR. Thus, in this case, electric field concentration is alleviated in the vicinity of a lower end of first portion ISO1 closer to source region SR, where electric field concentration is particularly likely to occur, and hot carrier injection is further suppressed.

Since first embedded portion GE1 and second embedded portion GE2 are provided, insulating isolation film ISO located below first embedded portion GE1 and second embedded portion GE2 has a thinner thickness, and the depletion layer easily extends below insulating isolation film ISO (i.e., a field plate effect). Therefore, when the ends of first embedded portion GE1 and second embedded portion GE2 closer to drain region DRA extend longer toward drain region DRA, the depletion layer more easily extends toward drain region DRA, which may cause a reduction in breakdown voltage.

In the semiconductor device according to the first embodiment, when the ends of first embedded portion GE1 and second embedded portion GE2 closer to drain region DRA are disposed closer to drift region DRI, than midpoint M between the end of first portion ISO1 closer to drain region DRA and the end of first portion ISO1 closer to drift region DRI, a reduction in OFF breakdown voltage between the source and the drain due to the field plate effect described above can be suppressed.

Table 1 shows maximum width W1 with which an electric field in drift region DRI sandwiched between second portion ISO2 and third portion ISO3 can be alleviated, when width W2 and width W3 are changed. In Table 1, depth D1 and depth D2 are 0.85 times depth D3, and the potential difference between drift region DRI and gate electrode GE is −15 V.

TABLE 1

| Width W2 and Width W3 (μm) | | Maximum width W1 with which electric field alleviation occurs in drift region DRI sandwiched between second portion ISO2 and third portion ISO3 (μm) |
|---|---|---|
| | 0.2 | 0.36 |
| | 0.15 | 0.44 |
| | 0.1 | 0.56 |
| | 0.05 | 0.76 |

As shown in Table 1, as width W2 and width W3 decrease, maximum width W1 with which the electric field in drift region DRI sandwiched between second portion ISO2 and third portion ISO3 can be alleviated increases. As width W1 increases, a current path spreads in the channel width direction, and a current amount increases.

Accordingly, when width W2 and width W3 are less than or equal to 0.3 μm in the semiconductor device according to the first embodiment, breakdown of second portion ISO2 and third portion ISO3 can be suppressed, while improving the current amount by alleviating electric field concentration in the vicinity of the end of first portion ISO1 closer to source region SR.

Table 2 shows maximum width W1 with which the electric field in drift region DRI sandwiched between second portion ISO2 and third portion ISO3 can be alleviated, when the ratio of depth D1 and depth D2 to depth D3 is changed. In Table 2, width W2 and width W3 are 0.1 μm, and the potential difference between drift region DRI and gate electrode GE is −15 V.

TABLE 2

| Ratio of Depth D1 and Depth D2 to Depth D3 | | Maximum width W1 with which electric field alleviation occurs in drift region DRI sandwiched between second portion ISO2 and third portion ISO3 (μm) |
|---|---|---|
| | 0.25 times | 0.37 |
| | 0.6 times | 0.42 |
| | 0.85 times | 0.56 |

As shown in Table 2, as the ratio of depth D1 and depth D2 to depth D3 increases, maximum width W1 with which the electric field in drift region DRI sandwiched between second portion ISO2 and third portion ISO3 can be alleviated increases. As described above, as width W1 increases, the current path spreads in the channel width direction, and the current amount increases.

Accordingly, when depth D1 and depth D2 are more than or equal to 0.25 times depth D3 in the semiconductor device according to the first embodiment, breakdown of second portion ISO2 and third portion ISO3 can be suppressed, while improving the current amount by alleviating electric field concentration in the vicinity of the end of first portion ISO1 closer to source region SR.

Drift region DRI disposed more outward in the channel width direction than the portion provided with second portion ISO2 and third portion ISO3 is not sandwiched between second portion ISO2 and third portion ISO3. Accordingly, in that drift region DRI, the depletion layer extends only from one side, and alleviation of electric field concentration is insufficient. As a result, when that drift region serves as a current path, hot carrier injection may occur in that drift region.

In the semiconductor device according to the first embodiment, when second portion ISO2 is disposed more outward than the end of drain region DRA in the channel width direction, and third portion ISO3 is disposed more inward than the end of drain region DRA in the channel width direction, there is no current path in which the electric field is not alleviated at the end of first portion ISO1 closer to source region SR. Therefore, in this case, the semiconductor device can further suppress hot carrier injection as a whole.

(Second Embodiment)

Hereinafter, a configuration of a semiconductor device according to a second embodiment will be described with reference to the drawings. In the following, differences from the first embodiment will mainly be described, and redundant description will not be repeated.

As shown in FIGS. 18, 19, 20, and 21, the semiconductor device according to the second embodiment has semiconductor substrate SUB, insulating isolation film ISO, and gate electrode GE. Semiconductor substrate SUB has source region SR, drain region DRA, drift region DRI, body region BR, and body contact region BCR. Further, insulating isolation film ISO has first portion ISO1, second portion ISO2, and third portion ISO3. Gate electrode GE has first embedded portion GE1 and second embedded portion GE2. In these points, the semiconductor device according to the second embodiment is in common with the semiconductor device according to the first embodiment.

In the semiconductor device according to the second embodiment, gate electrode GE has a third embedded portion GE3. In this point, the semiconductor device according to the second embodiment is different from the semiconductor device according to the first embodiment.

Third embedded portion GE3 is embedded in first portion ISO1. That is, third embedded portion GE3 extends in the direction toward second surface SS, in first portion ISO1. More specifically, a trench TR3 extending in the direction toward second surface SS is formed in first portion ISO1, and third embedded portion GE3 is embedded in trench TR3.

Figure 22:
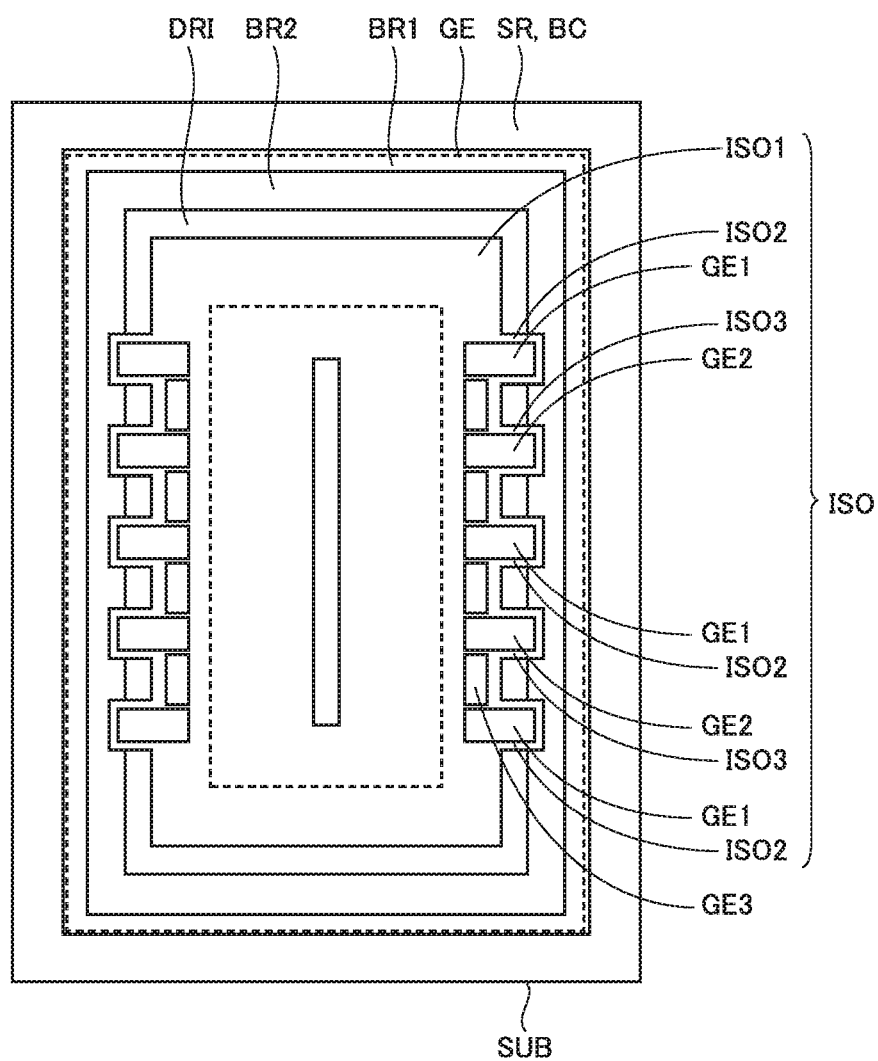
FIG. 22 is a top view in an input/output circuit of a semiconductor device according to a first modification of the second embodiment.

Third embedded portion GE3 is disposed so as to face drift region DRI sandwiched between second portion ISO2 and third portion ISO3. Third embedded portion GE3 may extend along the direction intersecting with the direction from source region SR toward drain region DRA (i.e., in the channel width direction). As shown in FIG. 22, when first embedded portion GE1 and second embedded portion GE2 extend to first portion ISO1 along the direction from source region SR toward drain region DRA, third embedded portion GE3 may be disposed between first embedded portion GE1 and second embedded portion GE2.

Figure 18:
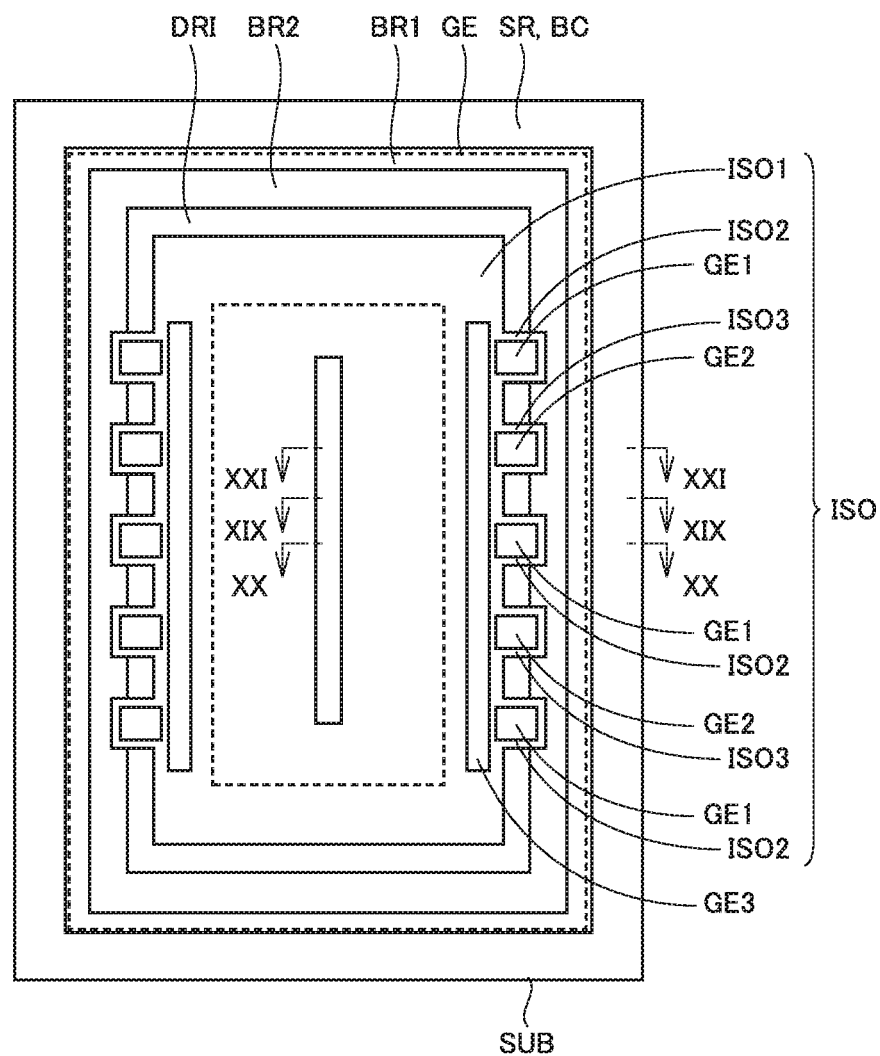
FIG. 18 is a top view in an input/output circuit of a semiconductor device according to a second embodiment.
Figure 19:
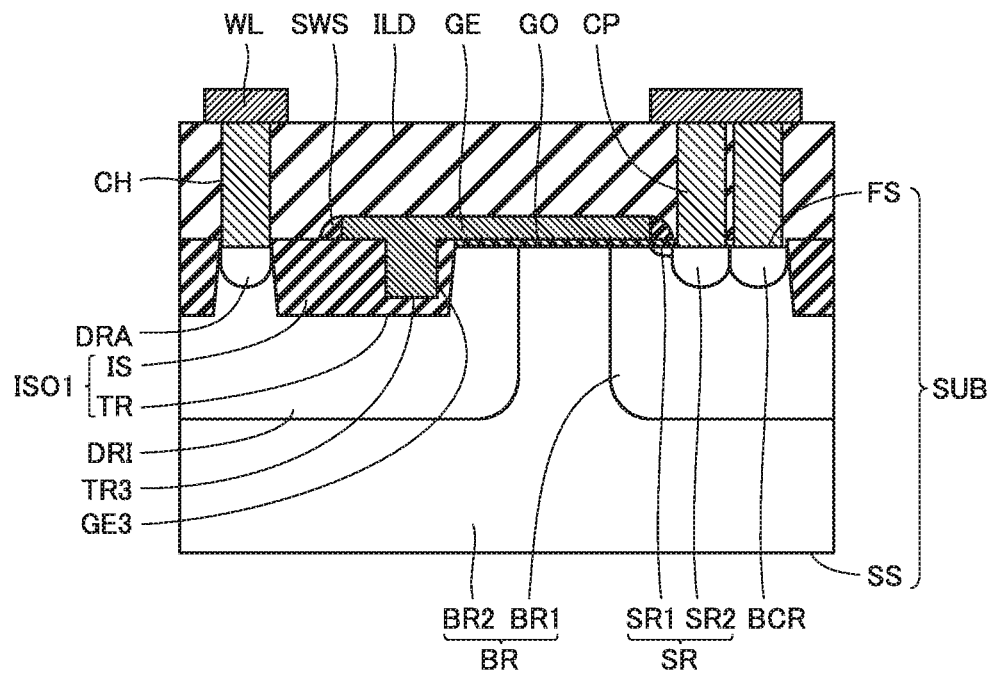
FIG. 19 is a cross sectional view in XIX-XIX of FIG. 18.
Figure 20:
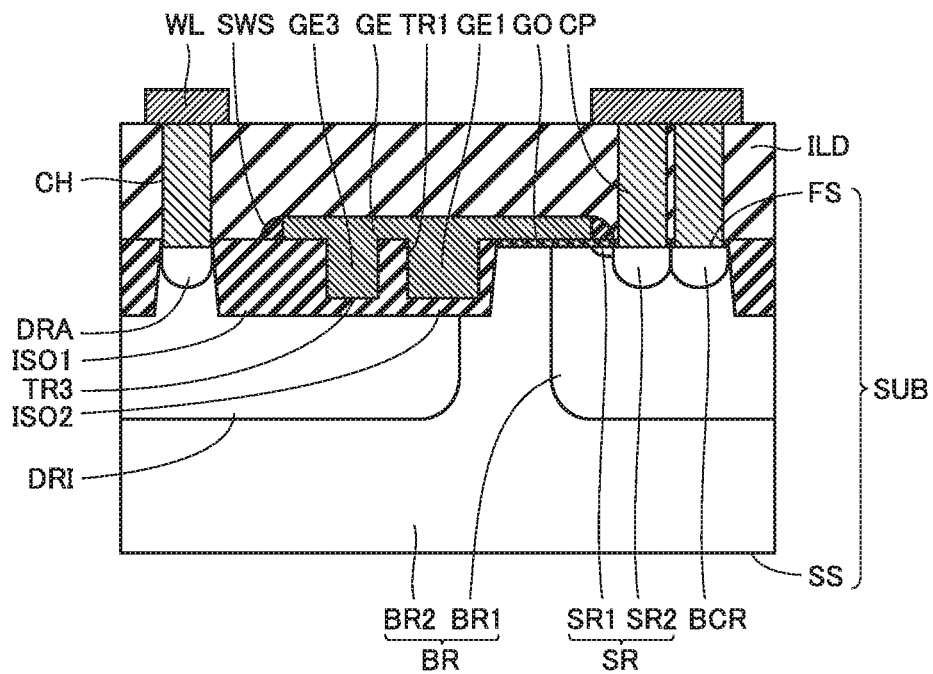
FIG. 20 is a cross sectional view in XX-XX of FIG. 18.
Figure 21:
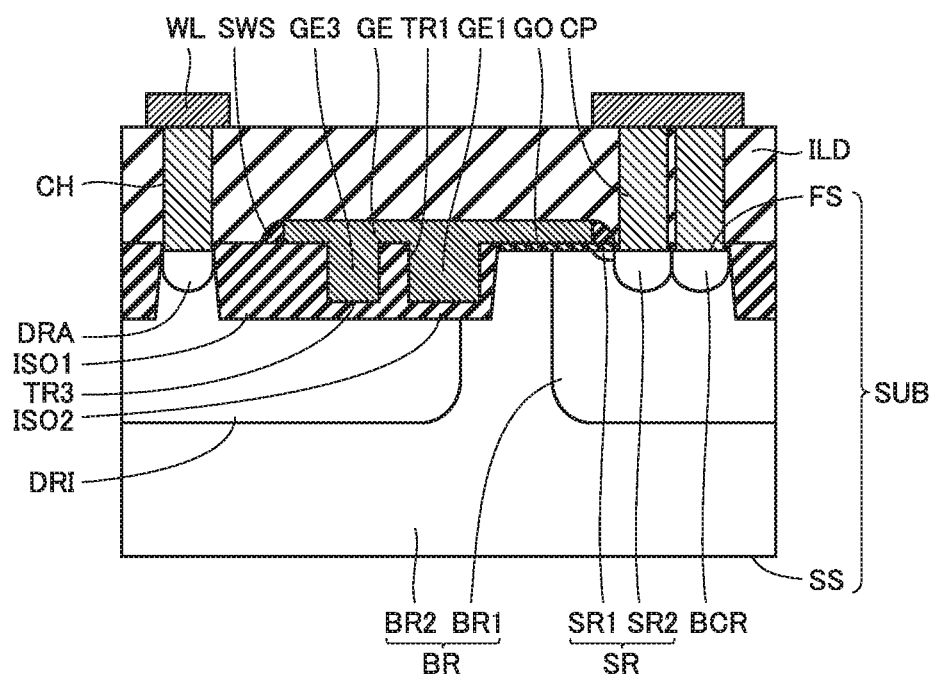
FIG. 21 is a cross sectional view in XXI-XXI of FIG. 18.
Figure 23:
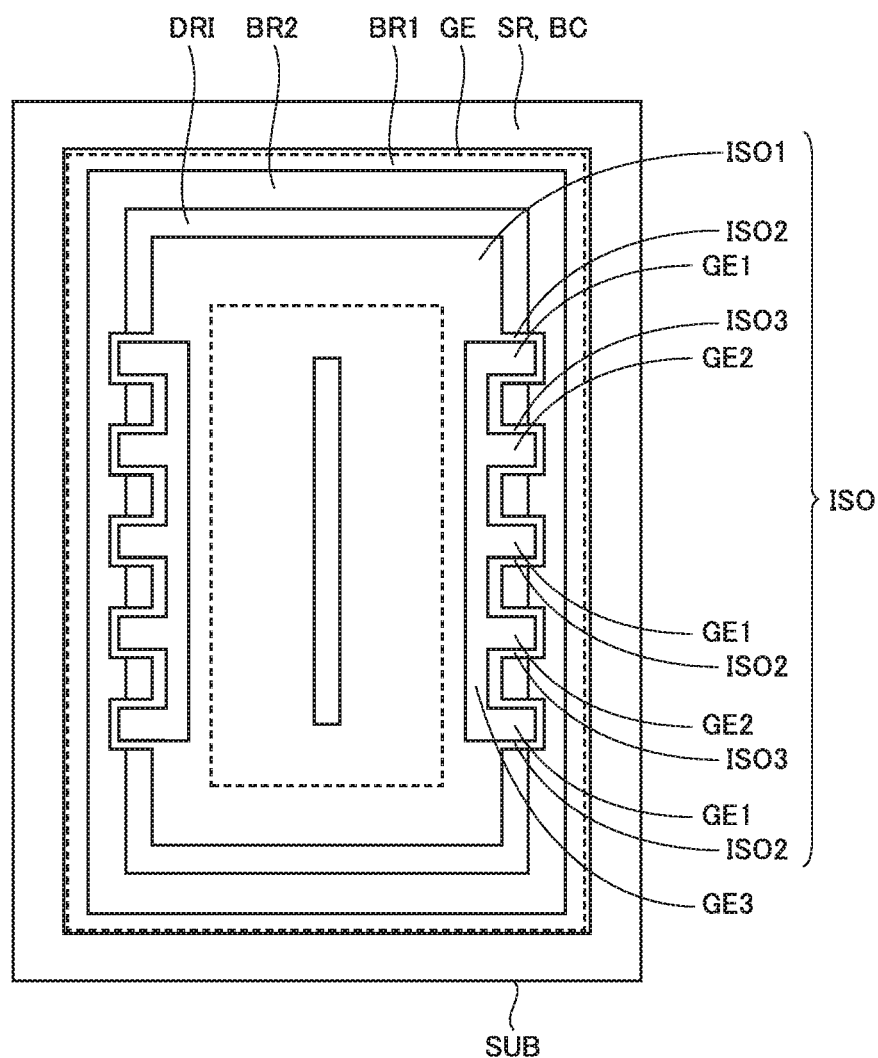
FIG. 23 is a top view in an input/output circuit of a semiconductor device according to a second modification of the second embodiment.

Third embedded portion GE3 may be formed to be separated from first embedded portion GE1 and second embedded portion GE2, as shown in FIG. 18. That is, trench TR1, trench TR2, and trench TR3 may be formed to be separated from one another. However, third embedded portion GE3 may be formed integrally with first embedded portion GE1 and second embedded portion GE2, as shown in FIG. 23.

Figure 24:
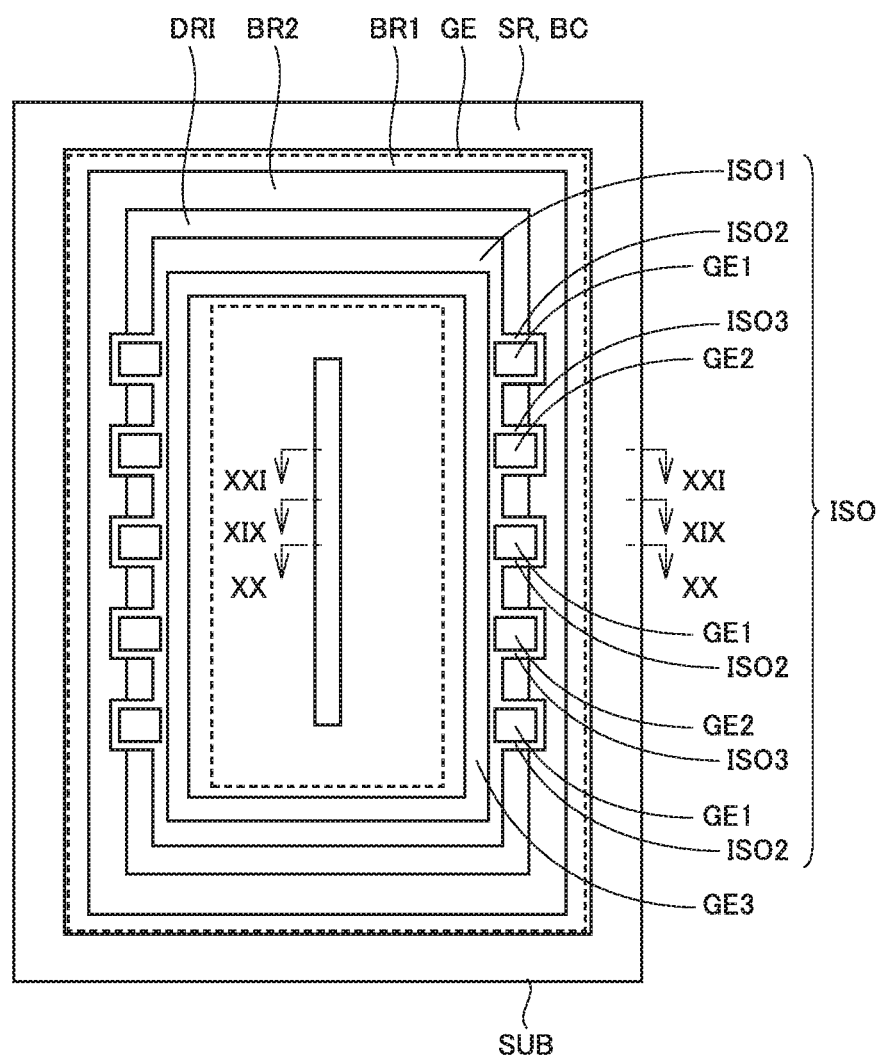
FIG. 24 is a top view in an input/output circuit of a semiconductor device according to a third modification of the second embodiment.

Third embedded portion GE3 may extend along the channel width direction to be more outward than the end of drain region DRA in the channel width direction, as shown in FIG. 18. Third embedded portion GE3 may be disposed so as to surround drain region DRA, as shown in FIG. 24.

Hereinafter, a method for manufacturing the semiconductor device according to the second embodiment will be described with reference to the drawings. The method for manufacturing the semiconductor device according to the second embodiment has front end step S1 and back end step S2.

Front end step S1 has first implantation step S11, insulating isolation film formation step S12, gate insulating film formation step S13, gate electrode formation step S14, second implantation step S15, sidewall spacer formation step S16, and third implantation step S17. Back end step S2 has interlayer insulating film formation step S21, contact plug formation step S22, and wiring formation step S23. In these points, the method for manufacturing the semiconductor device according to the second embodiment is the same as the method for manufacturing the semiconductor device according to the first embodiment.

However, the method for manufacturing the semiconductor device according to the second embodiment is different from the method for manufacturing the semiconductor device according to the first embodiment in details of gate electrode formation step S14.

Figure 25A:
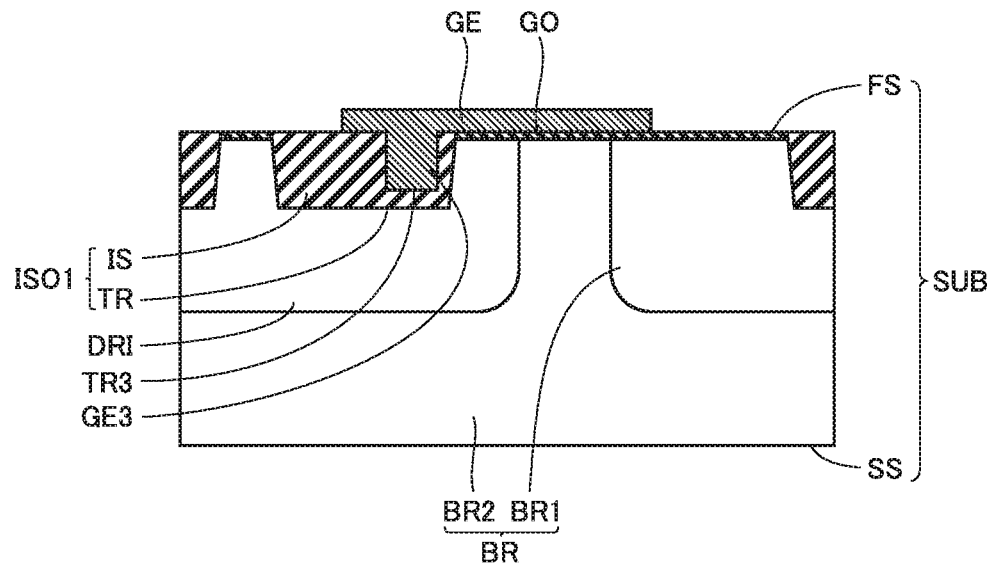
FIG. 25A is a cross sectional view of a portion of the semiconductor device according to the second embodiment in which a first portion is formed, in a gate electrode formation step.
Figure 25B:
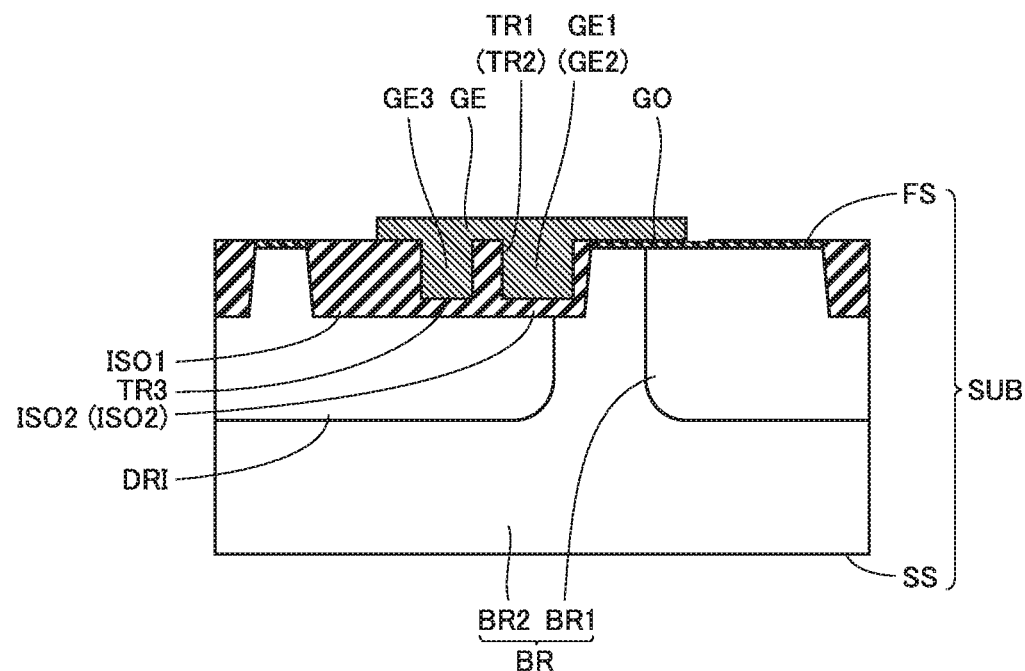
FIG. 25B is a cross sectional view of a portion of the semiconductor device according to the second embodiment in which a second portion and a third portion are formed, in the gate electrode formation step.

As shown in FIGS. 25A and 25B, in gate electrode formation step S14, gate electrode GE having first embedded portion GE1, second embedded portion GE2, and third embedded portion GE3 is formed. In the formation of gate electrode GE, first, formation of trench TR1 and trench TR2 is performed in second portion ISO2 and third portion ISO3, and formation of trench TR3 is performed in first portion ISO1. The formation of trench TR1, trench TR2, and trench TR3 is performed for example by anisotropic etching such as RIE, using a photoresist as a mask.

In the formation of gate electrode GE, second, deposition of a material which composes gate electrode GE is performed. The deposition of the material which composes gate electrode GE is performed for example by CVD or the like. Thereby, the material which composes gate electrode GE is deposited on gate insulating film GO, on insulating isolation film ISO, and in trench TR1, trench TR2, and trench TR3.

In the formation of gate electrode GE, third, patterning of deposited gate electrode GE is performed. The patterning of deposited gate electrode GE is performed for example by photolithography. Thus, gate electrode GE having first embedded portion GE1, second embedded portion GE2, and third embedded portion GE3 is formed.

Hereinafter, an effect of the semiconductor device according to the second embodiment will be described. As described above, third embedded portion GE3 is disposed so as to face drift region DRI sandwiched between second portion ISO2 and third portion ISO3. Accordingly, when a potential difference occurs between gate electrode GE and drift region DRI, a depletion layer extends from three directions in drift region DRI sandwiched between second portion ISO2 and third portion ISO3. Therefore, according to the semiconductor device according to the second embodiment, electric field concentration which occurs in the vicinity of the end of first portion ISO1 closer to source region SR is further alleviated, and hot carrier injection can be further suppressed.

When trench TR1, trench TR2, and trench TR3 are integrally formed in the semiconductor device according to the second embodiment, the shapes of openings in the photoresist used for forming trench TR1, trench TR2, and trench TR3 become complicated. As a result, the photoresist may have an unstable shape.

In contrast, when trench TR1, trench TR2, and trench TR3 are formed to be separated from one another in the semiconductor device according to the second embodiment, the shapes of openings in the photoresist used for forming trench TR1, trench TR2, and trench TR3 can be simplified. As a result, the photoresist can have a stable shape. As a result, dimensional accuracy of first embedded portion GE1, second embedded portion GE2, and third embedded portion GE3 can be improved.

When third embedded portion GE3 is partially provided, the field plate effect varies depending on the portion. That is, at the portion provided with third embedded portion GE3, breakdown voltage is reduced, whereas at the portion not provided with third embedded portion GE3, breakdown voltage is less likely to be reduced, and thus electric field balance at the time of breakdown worsens, and the transistor itself is likely to be broken (i.e., a current which can flow after breakdown decreases). When third embedded portion GE3 extends along the channel width direction to be more outward than the end of drain region DRA in the channel width direction (or when third embedded portion GE3 is disposed so as to surround drain region DRA) in the semiconductor device according to the second embodiment, influence on OFF breakdown voltage between the source and the drain by first embedded portion GE1, second embedded portion GE2, and third embedded portion GE3 (i.e., the field plate effect) can be equalized, which can suppress breakage of the transistor itself at the time of breakdown (i.e., a decrease in the current which can flow after breakdown).

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A semiconductor device comprising:
   a semiconductor substrate having a first surface;
   an insulating isolation film disposed at the first surface; and
   a gate electrode,
   the semiconductor substrate having a source region disposed in contact with the first surface, a drain region disposed in contact with the first surface, a drift region disposed in contact with the first surface so as to surround the drain region, and a body region sandwiched between the drift region and the source region and disposed in contact with the first surface so as to surround the source region,
   the source region, the drain region, and the drift region being of a first conductivity type,
   the body region being of a second conductivity type which is opposite to the first conductivity type,
   the insulating isolation film having a first portion disposed inside the drift region in plan view, a second portion protruding from the first portion in a direction toward the source region, and a third portion protruding from the first portion in the direction toward the source region and sandwiching the drift region between the second portion and the third portion,
   the gate electrode facing a portion of the body region sandwiched between the source region and the drift region with being insulated from the portion, and being disposed so as to extend over the second portion and the third portion, wherein
   the semiconductor substrate has a second surface opposite to the first surface,
   the gate electrode has a first embedded portion embedded in the second portion, and a second embedded portion embedded in the third portion,
   the drift region is sandwiched between the first embedded portion and the second embedded portion, and
   the gate electrode has a third embedded portion embedded in the first portion and facing the drift region sandwiched between the second portion and the third portion.

2. The semiconductor device according to claim 1, wherein each of an end of the first embedded portion and an end of the second embedded portion closer to the drain region is located closer to the drift region, than a midpoint between an end of the first portion closer to the drain region and an end of the first portion closer to the drift region.

3. The semiconductor device according to claim 1, wherein the second portion located between the first embedded portion and the drift region sandwiched between the second portion and the third portion has a width of less than or equal to 0.3 μm.

4. The semiconductor device according to claim 1, wherein the first embedded portion has a depth which is more than or equal to 0.25 times a depth of the insulating isolation film.

5. The semiconductor device according to claim 1, wherein
   the first embedded portion is embedded in a first trench extending toward the second surface in the second portion,
   the second embedded portion is embedded in a second trench extending toward the second surface in the third portion,
   the third embedded portion is embedded in a third trench extending toward the second surface in the first portion, and
   the first trench, the second trench, and the third trench are separated from one another.

6. The semiconductor device according to claim 1, wherein
   the third embedded portion extends toward a channel width direction which is a direction intersecting with a direction from the source region toward the drain region, and
   an end of the third embedded portion in the channel width direction is located more outward than an end of the drain region in the channel width direction.

7. The semiconductor device according to claim 1, wherein
   the second portion is disposed more outward than an end of the drain region in a channel width direction which is a direction intersecting with a direction from the source region toward the drain region, and
   the third portion is disposed more inward than the end of the drain region in the channel width direction.

* * * * *